United States Patent [19]

Takahashi et al.

[11] Patent Number: 5,546,011
[45] Date of Patent: Aug. 13, 1996

[54] VOLTAGE MEASURING APPARATUS

[75] Inventors: Hironori Takahashi; Shinichiro Aoshima, both of Hamamatsu, Japan

[73] Assignee: Hamamatsu Photonics K.K., Hamamatsu, Japan

[21] Appl. No.: 513,240

[22] Filed: Aug. 10, 1995

[30] Foreign Application Priority Data

Aug. 19, 1994 [JP] Japan .................................. 6-195385

[51] Int. Cl.$^6$ ................................................. G01R 31/00
[52] U.S. Cl. ............................................ 324/753; 324/96
[58] Field of Search ............................... 324/158.1, 73.1, 324/96, 752, 753, 765, 244.1; 356/400, 401, 396, 364; 359/248, 246, 249

[56] References Cited

U.S. PATENT DOCUMENTS

| | | | |
|---|---|---|---|
| 4,446,425 | 5/1984 | Valdmanis et al. | 324/77 |
| 4,618,819 | 10/1986 | Mourou et al. | 324/77 |
| 4,996,475 | 2/1991 | Takahashi et al. | 324/96 |
| 5,166,754 | 11/1992 | Suzuki et al. | 356/400 |
| 5,432,607 | 7/1995 | Taubenblatt | 356/364 |

FOREIGN PATENT DOCUMENTS 59-17170  1/1984  Japan .

OTHER PUBLICATIONS

Kolner et al, "Electrooptic Sampling in GaAs Integrated Circuits", IEEE Journal of Quantum Electronics, 1986, pp. 79–93 (unavailable month).

Valdmanis et al, "Subpicosecond Electrooptic Sampling: Principles and Applications", IEEE Journal of Quantum Electronics, vol. OE–22, No. 1, Jan. 1986, pp. 69–78.

Aoshima et al, "Non–Contact Picosecond Electro–Optic Sampling with a Semiconductor Laser", T. IEEE, Japan, vol. 111–C, No. 4, 1991, pp. 145–154.

Takahashi et al, "How the Electro–Optic Probing System can Contribute to LSI Testing?", IMTC94, May 10–12, Hamamatsu, pp. 1484–1491.

Primary Examiner—Vinh P. Nguyen
Attorney, Agent, or Firm—Cushman Darby & Cushman, L.L.P.

[57] ABSTRACT

An electro-optic material constituting an E-O probe has a refractive index for light from a semiconductor laser, which is changed in accordance with an electric field from a device to be measured. The electro-optic effect is substantially canceled upon incidence of light from an Ar$^+$ laser. A mechanical chopper modulates the light emitted from the Ar$^+$ laser and causes the light to be incident on the E-O probe. A lock-in amplifier detects the polarized state of the light reflected by the E-O probe synchronized with the modulation, thereby measuring the voltage of the device.

9 Claims, 17 Drawing Sheets

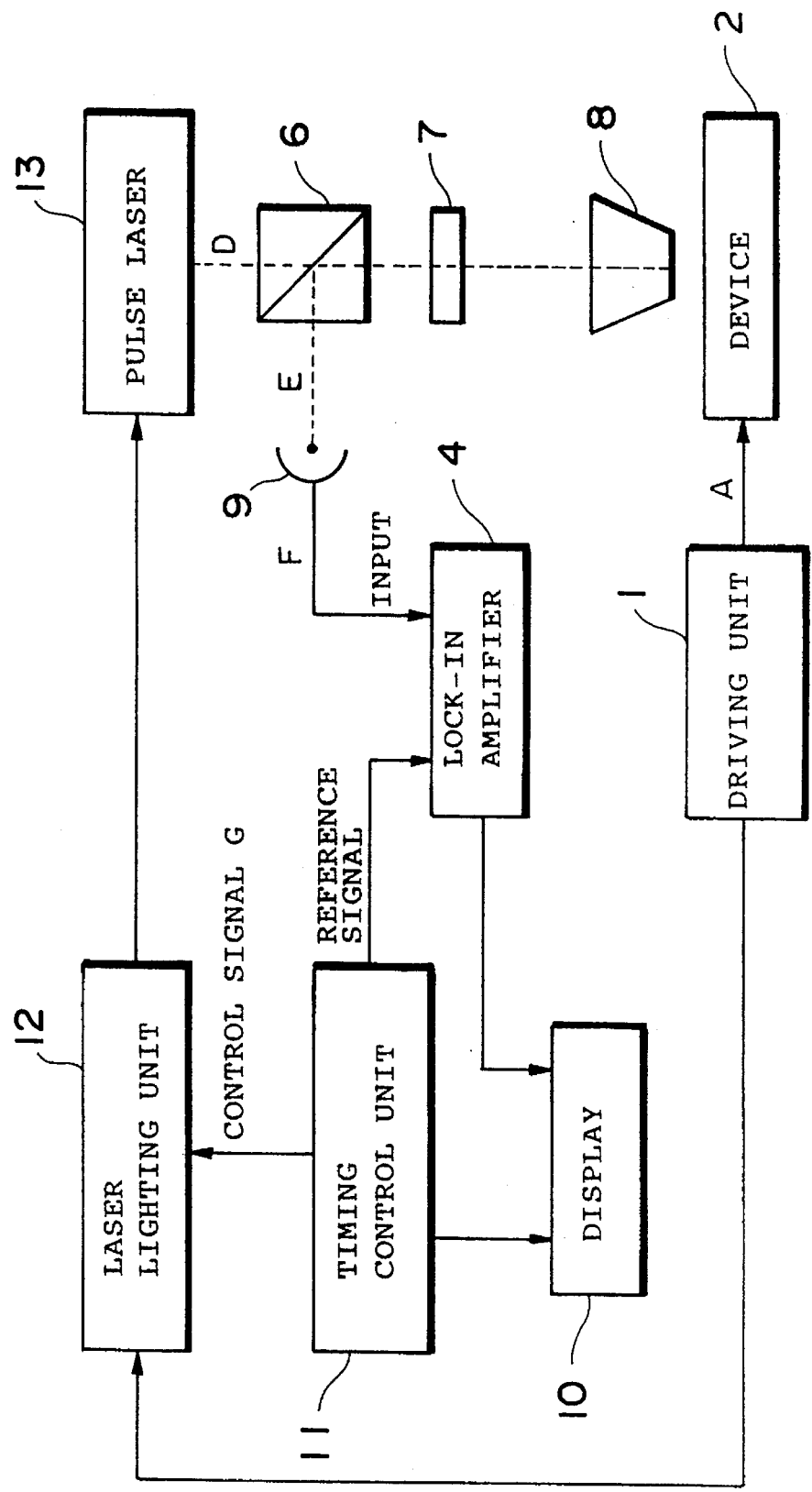

VOLTAGE MEASURING APPARATUS

BACKGROUND OF THE INVENTION

1. Field of the Invention

The present invention relates to a voltage measuring apparatus for measuring the voltage of an object to be measured by using an electro-optic material whose refractive index changes in correspondence with a change in electric field.

2. Related Background Art

In a conventional voltage measuring apparatus of this type, an electro-optic (E-O) probe is arranged near an object to be measured, thereby measuring the voltage of the object. This E-O probe is formed of an electro-optic material having an electro-optic effect representing that the refractive index changes upon application of an electric field. The electric field applied to the E-O probe has a value according to the voltage of the object to be measured.

SUMMARY OF THE INVENTION

In the voltage measuring apparatus using such an E-O probe, normally, some modulation is applied to voltage measurement, and narrow-band synchronous detection of the voltage of the object to be measured is performed at the modulation frequency, thereby detecting a small change in voltage of the object at a high signal to noise (S/N) ratio.

The following are voltage measuring apparatuses for applying modulation.

First, an apparatus which turns on/off or chopping, i.e., pulse-modulating an electrical signal itself to be measured is known. In a voltage measuring apparatus of 1-1 shown in FIG. 8, a pulse modulation unit 3 is inserted between a driving unit 1 and a device 2 to be measured to perform pulse modulation of an electrical signal supplied to the device 2 to be measured.

More specifically, an electrical signal A to be measured having a pulse-like repetitive waveform at a frequency of 100 MHz, which is shown in FIG. 9(a), is output from the driving unit 1. The pulse modulation unit 3 modulates the electrical signal A into an electrical signal C shown in FIG. 9(c) on the basis of a reference signal B shown in FIG. 9(b).

A frequency of 1 to 100 kHz is used as a modulation frequency. The reference signal B is also supplied to a lock-in amplifier 4. Continuous emission light D shown in FIG. 9(d) is emitted from a CW laser 5 as probe light. This emission light D is transmitted through a polarization beam splitter (PBS) 6, incident on an E-O probe 8 through a λ/8 plate 7, and reflected by a mirror (not shown) on the bottom surface of the E-O probe 8. The reflected light is deflected by the PBS 6 at a right angle and supplied to a photodetector 9.

In this apparatus, since the λ/8 plate 7 is arranged in the optical path, and an optical bias having a ¼ wavelength is applied in the two ways, the intensity of light E which is incident from the PBS 6 onto the photodetector 9 in the absence of the target measurement electrical signal is ½ that reflected by the E-O probe 8 and returned to the PBS 6.

When the electrical signal is supplied to the device 2 to be measured the light E incident on the photodetector 9 slightly changes, as shown in FIG. 9(e). The photodetector 9 receives the light E and outputs an electrical signal F shown in FIG. 9(f). A change in waveform at 100 MHz is not detected because the response speed of the photodetector 9 is low.

More specifically, the output from the photodetector 9 changes synchronized with pulse modulation. The lock-in amplifier 4 uses the reference signal B from the pulse modulation unit 3 to perform narrow-band synchronous detection of an output from the photodetector 9. At this time, only a changed component can be detected at a high S/N ratio because the lock-in amplifier 4 performs narrow-band synchronous detection without being affected by a large DC output. This detection output is displayed on a display 10.

In the above first apparatus, the continuous light from the CW laser is used as probe light. However, even by a sampling method using a pulse light source as a light source, similar modulation as in apparatus 1-1 can be performed.

FIG. 10 is a block diagram showing the arrangement of a voltage measuring apparatus 1-2. FIGS. 11A to 11C are timing charts of optical and electrical signals at the respective portions of this apparatus. The same reference numerals as in FIG. 8 denote the same parts in FIG. 10, and a detailed description thereof will be omitted.

In the sampling method, the timing relationship between a target measurement electrical signal and probe pulse light is gradually shifted to measure the waveform. For this purpose, a control signal G shown in FIG. 11A is supplied from a timing control unit 11 to a laser lighting unit 12.

In addition to the sawtooth wave shown in FIG. 11A, a triangular wave or the like can also be used as a control signal. The period of the control signal G is set long at, e.g., 0.1 to 10 Hz. Timings ①, ②, and ③ correspond to the sampling phases of an electrical signal A to be measured.

The relative timing relationship between the electrical signal to be measured and the probe light is shifted in accordance with the peak of the sawtooth wave. The electrical signal A is sampled with the probe light at the timings ①, ②, and ③. A pulse laser 13 emits the pulsed strobe light at the repetition frequency of 100 MHz, which is the same as that of the target measurement electrical signal A output from a driving unit 1 and shown in FIG. 11B(a).

The repetition frequency is sufficiently higher than the modulation frequency of a pulse modulation unit 3, so these two frequencies need not always be synchronized with each other. The pulse laser 13 emits light pulses D controlled by the timing control unit 11 at the timings ①, ②, and ③ shown in FIG. 11B(b). FIGS. 11C(a) and 11C(b) are partially enlarged views of the waveforms in FIGS. 11B(a) and 11B(b).

At the timing ①, light E does not change because the waveform of the light pulse D shown in FIG. 11C(b) and the waveform of the electrical signal A to be measured shown in FIG. 11C(a) do not overlap. At the timing ②, the light E largely changes because the light pulse D matches the peak of the electrical signal A. At the timing ③, the light E slightly changes because the light pulse D is emitted at the attenuation time of the target measurement electrical signal A.

As in the apparatus 1-1, the electrical signal A to be measured is modulated by a reference signal B shown in FIG. 11B(c) into a signal C shown in FIG. 11B(d). Therefore, light incident from a PBS 6 onto a photodetector 9 is represented by the light pulse E shown in FIG. 11B(e).

Since the response speed of the photodetector 9 is slow, the light pulses E are detected as a constant output without being resolved.

However, a change in output caused by the pulse modulation can be detected because the pulse modulation frequency is low on the order of kHz, as described above. For this reason, an output signal F shown in FIG. 11B(f) can be obtained from the photodetector 9 as the output shown in FIG. 9(f). The output signal F is detected by a lock-in amplifier 4 at a high S/N ratio.

Second, a voltage measuring apparatus according to the second apparatus uses a high-speed photodetector as a device to be measured. FIG. 12 is a block diagram showing the arrangement of this voltage measuring apparatus. FIGS. 13A to 13D are timing charts of optical and electrical signals at the respective portions of this apparatus.

The same reference numerals as in FIG. 10 denote the same parts in FIG. 12, and a detailed description thereof will be omitted. In this apparatus, light from a pulse laser 13 is divided by a half mirror 14 to probe light D shown in FIG. 13A, which is incident on an E-O probe 8, and excitation light H which is incident on a high-speed photodetector 2a serving as a device 2 to be measured.

The excitation light H is delayed as shown in FIG. 13B through an optical delay unit 15 constituted by a total reflecting mirror 15a and a moving stage 15b and incident on a mirror 16. The excitation light H reflected by the mirror 16 is chopped by a mechanical chopper 17 into modulation light J shown in FIG. 13C(a).

An acoustic optical modulator (AOM) may also be used in place of the mechanical chopper 17. When the high-speed photodetector 2a is operated with the modulation light J, the similar electrical signal as in the voltage measuring apparatus shown in FIG. 10 can be obtained.

More specifically, when the device 2 receives a voltage from a bias voltage supply unit 18, the high-speed photodetector 2a outputs a pulse-modulated electrical signal to be measured shown in FIG. 13C(b). FIGS. 13D(a) and 13D(b) are partially enlarged views of FIGS. 13C(a) and 13C(b), respectively.

With an optical delay amount ①, the probe pulse light D shown in FIG. 13D(a) is emitted when the voltage of the electrical signal shown in FIG. 13D(b) is zero.

With an optical delay amount ②, the probe pulse light D is emitted at the peak timing of the electrical signal to be measured.

With an optical delay amount ③, the probe pulse light D is emitted at the attenuation timing of the electrical signal to be measured.

Therefore, output light E from a PBS 6 to a photodetector 9 is as shown in FIG. 13C(c), and a signal F shown in FIG. 13C(d) is output from the photodetector 9 to a lock-in amplifier 4.

In this voltage measuring apparatus as well, the voltage of the device 2 to be measured can be measured at a high S/N ratio.

Third, a voltage measuring apparatus according to the third apparatus is disclosed in Japanese Patent Laid-Open No. 3-131772 by the present inventors. This voltage measuring apparatus uses a sampling method in which the emission timing of a light source is modulated.

FIG. 14 is a block diagram showing the arrangement of the voltage measuring apparatus. FIGS. 15A to 15F are timing charts of optical and electrical signals at the respective portions of the apparatus.

The same reference numerals as in FIG. 10 denote the same parts in FIG. 14, and a detailed description thereof will be omitted.

This apparatus is largely different from the voltage measuring apparatus according to apparatus 1-2 shown in FIG. 10 in a control signal G, which is an output from a timing control unit 11 to a laser lighting unit 12. In the voltage measuring apparatus shown in FIG. 10, the control signal G exhibits a simple sawtooth wave.

However, in this apparatus, the sawtooth wave is pulse-modulated, as shown in FIG. 15A. More specifically, a pulse laser 13 is emitted at the above modulation frequency alternately at a certain reference timing and at a measurement timing, and this measurement timing is gradually shifted to measure the waveform of an electrical signal to be measured.

FIG. 15B is an enlarged view of the control signal G at timings ①, ②, and ③ shown in FIG. 15A. The peak of the control signal G becomes higher from the timing ① to the timing ③.

FIG. 15C shows an electrical signal A output from a driving unit 1 to a device 2 to be measured. The pulse laser 13 emits a light pulse D shown in FIG. 15D by the laser lighting unit 12. The light pulse D is emitted at the reference timing while the control signal G shown in FIG. 15B is not applied. The light pulse D is turned on at the measurement timing while the control signal G is applied.

FIG. 15E (a) and (b) are enlarged views of portions indicated by arrows in FIGS. 15C and 15D. At each timing, a reference timing T1 shown in FIG. 15E(b) is set to a timing while the voltage of the electrical signal A to be measured shown in FIG. 15E(a) is zero.

In this case, at the reference timing T1, the electrical signal A to be measured is equivalent to that in a modulation OFF state in the voltage measuring apparatus shown in FIG. 10 because it is not sampled with the light pulse D.

At a measurement timing T2 shown in FIG. 15E (b), however, the signal is set in the same state as in the modulation ON state, and the electrical signal A to be measured is sampled with the light pulse D at each timing.

Therefore, light E shown in FIG. 15F(a) emerges from a PBS 6 to a photodetector 9. A signal F shown in FIG. 15F(b) is output from the photodetector 9. When this signal F is detected by a lock-in amplifier 4 synchronized with the modulation timing of the emission timing of the pulse laser 13, the voltage can be measured at a high S/N ratio, as in the voltage measuring apparatus shown in FIG. 10.

Fourth, a voltage measuring apparatus according to the fourth apparatus 4-1 is disclosed in Japanese Patent Laid-Open No. 3-158767 by the present inventors.

FIG. 16 is a block diagram showing the arrangement of this apparatus. The same reference numerals as in FIG. 14 denote the same parts in FIG. 16, and a detailed description thereof will be omitted.

When a device 2 to be measured as an integrated circuit is vibrated by a vibrator 19, the distance between an E-O probe 8 and the device 2 changes. As the distance between the device 2 and the E-O probe 8 increases, the voltage applied to the E-O probe 8 decreases, and the modulation output decreases accordingly.

That is, predetermined modulation can be applied to voltage measurement by using this change in distance. Japanese Patent Laid-Open No. 3-158767 also discloses a voltage measuring apparatus according to apparatus 4-2 shown in FIG. 17.

The same reference numerals as in FIG. 16 denote the same parts in FIG. 17, and a detailed description thereof will be omitted.

In this apparatus, a chopper 21 which is a rotary shutter for shielding an electric field is arranged between an E-O probe 8 and a device 2. The chopper 21 is constituted by a motor 21a and a chopper main body 21b attached to the rotating shaft. Windows having the same shape as that of the end of the E-O probe 8 are formed in the chopper main body 21b at an equal angular interval.

When the chopper main body 21b is rotated, an electric field applied from the device 2 to the E-O probe 8 is shielded at a predetermined timing. Shielding of the electric field by the rotating shutter is equivalent to pulse modulation of the electrical signal to be measured in the voltage measuring apparatus shown in FIG. 8.

Therefore, in the above voltage measuring apparatuses as well, the voltage can be measured at a high S/N ratio.

Fifth, a voltage measuring apparatus according to the fifth apparatus is disclosed in Japanese Patent Laid-Open No. 5-240884.

FIG. 18 is a block diagram showing the arrangement of this apparatus.

The same reference numerals as in FIG. 8 denote the same parts in FIG. 18, and a detailed description thereof will be omitted.

A transparent electrode 22 is arranged on the rear surface of an E-O probe 8. A voltage is applied to the transparent electrode 22 by an oscillator 23. When modulation corresponding to a voltage $V_s$ shown in FIG. 20(a) is applied from the oscillator 23 to the transparent electrode 22, and the voltage of a device 2 to be measured is zero, an output from a photodetector 9 changes as shown in FIG. 19.

More specifically, when the voltage to be measured is zero, the output from the photodetector 9 changes between a point (A) and a point (C) and becomes constant $P_0$, as indicated by a dotted line in FIG. 20(b). For this reason, an output from a synchronized detector (lock-in amplifier) 4 becomes zero.

On the other hand, when the target measurement voltage is V, the output from the photodetector 9 changes between a point (B) and a point (D) shown in FIG. 19, and changes between $(P_0+\Delta P)$ and $(P_0-\Delta P)$, as indicated by a solid line in FIG. 20(b). For this reason, the output from the synchronized detector 4 is represented by $\Delta P$.

Therefore, the voltage of the device 2 can be measured at a high S/N ratio without applying any modulation to the device to be measured.

However, the above conventional voltage measuring apparatuses have the following problems. In both the voltage measuring apparatus according to apparatus 1-1 shown in FIG. 8 and the voltage measuring apparatus according to apparatus 1-2 shown in FIG. 10, the electrical signal to be measured is distorted to disable accurate measurement.

More specifically, in these voltage measuring apparatuses, since the pulse modulation unit is arranged between the device to be measured and the driving unit, and the electrical signal itself, which is applied to the device, is modulated, the electrical signal to be measured is distorted.

In the voltage measuring apparatus according to the second apparatus shown in FIG. 12, the electrical to be measured signal cannot be distorted because this apparatus does not use an additional element such as a pulse modulation unit.

However, modulation of voltage measurement is performed by intensity modulation of the excitation light, so that the device to be measured is limited to, e.g., a photodetector driven with the excitation light. For this reason, the voltage measuring apparatus according to the second apparatus cannot be applied to a general device such as an IC.

In the voltage measuring apparatus according to the third apparatus shown in FIG. 14, the emission timing of the pulse laser is modulated using the pulse-modulated sawtooth wave. Therefore, in this voltage measuring apparatus, the emission timing of the pulse laser must be precisely and complexly controlled.

The voltage measuring apparatus according to apparatus 4-1 shown in FIG. 16 has an arrangement in which the device to be measured is vibrated to apply modulation to voltage measurement. However, it is technically difficult to actually vibrate the device without bringing it into contact with the E-O probe.

The voltage measuring apparatus according to apparatus 4-2 shown in FIG. 17 has an arrangement in which modulation is applied to voltage measurement by rotating the shutter between the E-O probe and the device to be measured. In this arrangement, it is technically difficult to actually rotate the shutter without bringing it into contact with the E-O probe and the target measurement device.

The voltage measuring apparatus according to the fifth apparatus shown in FIG. 18 has an arrangement in which a modulation voltage is applied to the transparent electrode arranged on the rear surface of the E-O probe. The to-be-applied modulation voltage $V_s$ is so-called the half-wave voltage of the E-O probe, which has a very large value of several kV.

Therefore, in the voltage measuring apparatus according to the fifth apparatus, when such a high voltage is actually applied to the E-O probe, discharge may occur between the E-O probe and the device to be measured.

The present invention has been made to solve the above problems. According to the present invention, there is provided a voltage measuring apparatus comprising a probe comprised of an electro-optic material having an electro-optic effect representing that a refractive index for first light is changed in accordance with an applied electric field, the electro-optic effect being substantially canceled upon incidence of second light, a first light source for irradiating the first light on the probe, a second light source for irradiating the second light on the probe, modulation means for modulating the second light, and measurement means for detecting a polarized state of the first light reflected by the probe synchronized with modulation of the second light, thereby measuring a voltage of a device.

The electro-optic material has a photoconductive effect, and the electro-optic effect is substantially canceled upon incidence of the second light.

The electro-optic material has a photorefractive effect or an optical damaging effect, and the electro-optic effect is substantially canceled upon incidence of the second light.

The electro-optic material is a ZnTe crystal.

The voltage of the device is a DC voltage.

While the second light is irradiated from the second light source on the probe, the electro-optic effect of the electro-optic material of the probe is substantially canceled. For this reason, during this time, the polarized state of the first light incident on the probe does not change regardless of the voltage of the device to be measured.

Therefore, when the second light is modulated by the modulation means and incident on the probe, modulation is applied to voltage measurement of the device.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 14 is a block diagram showing a voltage measuring apparatus according to the third apparatus;

DETAILED DESCRIPTION OF THE PREFERRED EMBODIMENTS

Figure 1:
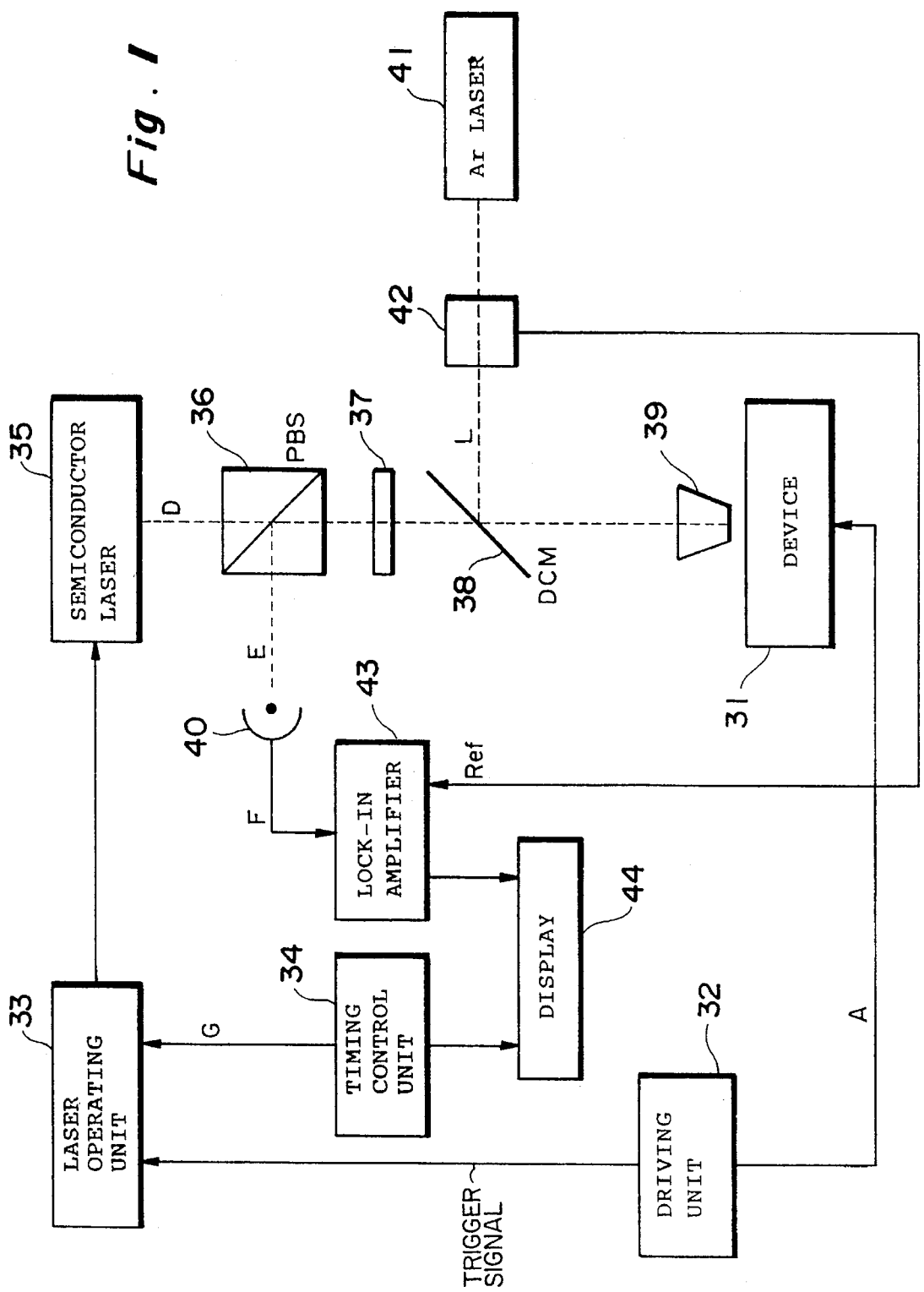
FIG. 1 is a block diagram showing the arrangement of a voltage measuring apparatus according to the first embodiment of the present invention.

FIG. 1 is a block diagram showing a voltage measuring apparatus according to an embodiment of the present invention.

Figure 2A:
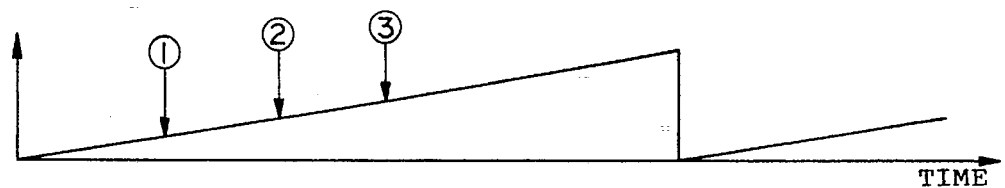
FIGS. 2A to 2C are timing charts showing optical and electrical signals at the respective portions of the voltage measuring apparatus according to the first embodiment.
Figure 2B:
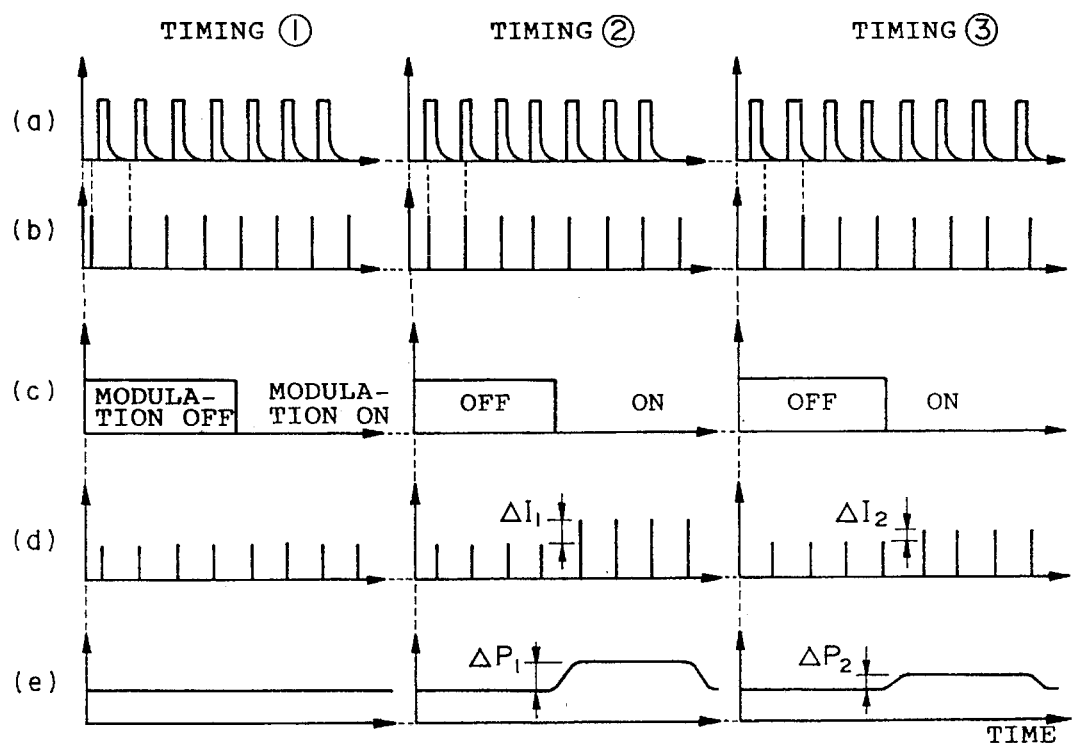
Figure 2C:
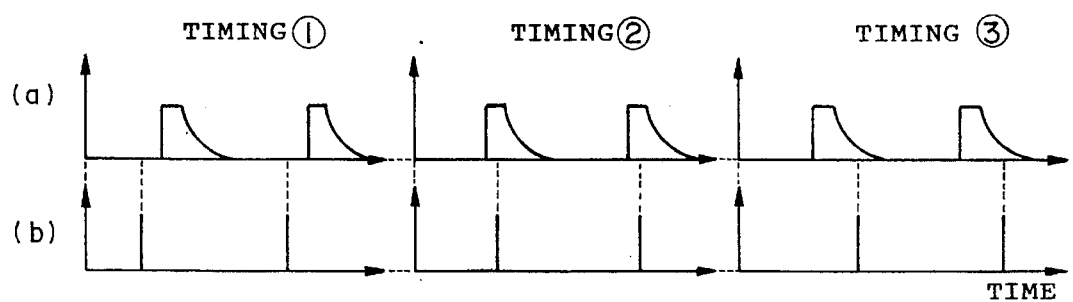

FIGS. 2A to 2C are timing charts of optical and electrical signals at the respective portions of this apparatus.

FIG. 2A shows a control signal G output from a timing control unit 34 (to be described later) to a laser operating unit 33.

FIG. 2B($a$) shows a electrical signal A output from a driving unit 32 to a device 31 to be measured.

FIG. 2B($b$) shows a light pulse D emitted from a semiconductor laser 35.

FIG. 2C($a$) is an enlarged view of the target measurement electrical signal A shown in FIG. 2B($a$).

FIG. 2C($b$) is an enlarged view of the light pulse D shown in FIG. 2B($b$).

FIG. 2B($c$) shows an output L from an $Ar^+$ laser 41, which is irradiated on an E-O probe 39.

FIG. 2B($d$) shows light E output from a PBS 36 to a photodetector 40.

FIG. 2B($e$) shows a signal F output from the photodetector 40 to a lock-in amplifier 43.

The pulse-like electrical signal A at a repetition frequency of 100 MHz shown in FIG. 2B($a$) is supplied from the driving unit 32 to the device 31 to be measured. A trigger signal is output from the driving unit 32 to the laser operating unit 33 synchronized with the electrical signal A. The control signal G having a sawtooth waveform shown in FIG. 2A is supplied from the timing control unit 34 to the laser operating unit 33.

The semiconductor laser 35 has a wavelength of 780 nm, which is pulsed on by the laser operating unit 33 to emit the light pulse D having a pulse width of 30 ps. The emission timing is gradually shifted on the basis of the control signal G from the timing control unit 34. The electrical signal A is sampled and measured at timings ①, ②, and ③ shown in FIG. 2A.

The light pulse D emitted from the semiconductor laser 35 is converted into linearly polarized light by the PBS 36, applied with an optical bias by a λ/8 plate 37, and incident on a dichroic mirror (DCM) 38. The exit light is incident on the E-O probe 39 through the DCM 38 and reflected by a reflecting film (not shown) on the bottom surface of the E-O probe 39.

At this time, the polarized state of the light incident on the E-O probe 39 changes in accordance with an electric field from the target measurement electrical signal A supplied to the device 31 to be measured. The light reflected by the bottom surface of the E-O probe 39 passes through the DCM 38 and the λ/8 plate 37 again. Only the light E corresponding to a component perpendicular to the incident light is output from the PBS 36 and detected by the photodetector 40.

A laser beam from the $Ar^+$ laser 41 having wavelength of 514.5 nm is incident on this optical system. This laser beam is chopped by, e.g., a mechanical chopper 42 at a frequency of 1 kHz, converted into the light L having a waveform shown in FIG. 2B($c$), and incident on the DCM 38. For this reason, the light D emitted from the semiconductor laser 35 and the light L emitted from the $Ar^+$ laser 41 are synthesized in the DCM 38, and this synthesized light is incident on the E-O probe 39.

A reference signal Ref is supplied from the mechanical chopper 42 to the lock-in amplifier 43. Therefore, the output F from the photodetector 40 is measured synchronized with the mechanical chopper 42, as will be described later. An output from the lock-in amplifier 43 and an output from the timing control unit 34 are supplied to a display 44, thereby obtaining an output waveform.

The E-O probe 39 of this embodiment is formed of a ZnTe crystal having a large electro-optic coefficient. Additionally, in this case, a crystal having a large resistivity is used.

The reason for this is as follows. The voltage of the device 31 to be measured is dividedly applied to the air layer between the E-O probe 39 and the device 31, and the E-O probe 39. At this time, the ratio of the voltage applied to the E-O probe 39 and the air layer is proportional to the impedance ratio.

Therefore, a crystal having a large resistivity is generally used for the E-O probe such that the voltage is effectively applied.

Figure 3:
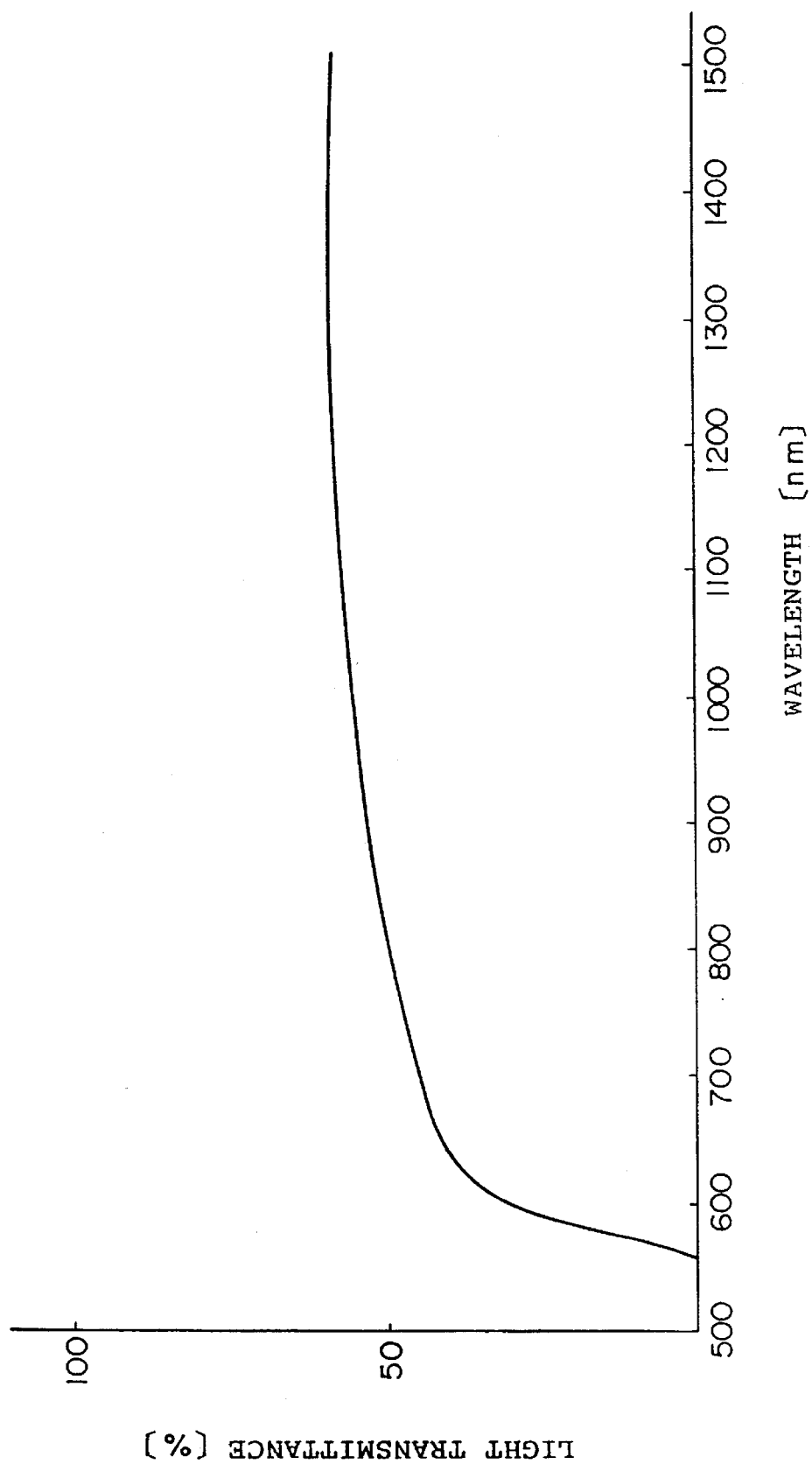
FIG. 3 is a graph showing the light transmittance vs. wavelength characteristics of a ZnTe crystal used for the E-O probe of the voltage measuring apparatus according to the first embodiment.

FIG. 3 is a graph showing the light transmittance characteristics of the ZnTe crystal used for the E-O probe 39. A wavelength [nm] is plotted along the abscissa, and a light transmittance [%] is plotted along the ordinate. The maximum transmittance is about 60%, though it is caused by the reflected light on the surface, and the light is rarely absorbed.

As shown in this graph, since the band absorption edge of the ZnTe crystal is 560 nm, the light from the semiconductor laser 35 having a wavelength of 780 nm is transmitted through the ZnTe crystal of the E-O probe 39 and rarely absorbed. For this reason, this light can be used as the light source of the voltage measuring apparatus, i.e., the probe light.

However, light having a wavelength of 560 nm or less is absorbed in the ZnTe crystal, as shown in this graph. When the light having a wavelength of 560 nm or less is incident on the E-O probe 39, this light is absorbed in the ZnTe crystal. When the light is absorbed in the crystal, charges are generated and the resistance of the ZnTe crystal is decreased by the photoconductive effect.

As a result, the voltage from the device 31 to be measured is hardly applied to the E-O probe 39, thereby substantially canceling the electro-optic effect of the ZnTe crystal.

Therefore, even when the probe light is incident on the E-O probe 39, the polarized state of the incident light does not change in accordance with the voltage.

In this embodiment, the light emitted from the Ar$^+$ laser 41 has a wavelength of 514.5 nm, which is shorter than 560 nm which is the absorption edge of the ZnTe crystal. The electro-optic effect of the ZnTe crystal is substantially canceled while the light is incident from the Ar$^+$ laser 41 onto the E-O probe 39.

At this time, the light reflected by the E-O probe 39 is in the same polarized state as in incidence onto the E-O probe 39. Therefore, when the light emitted from the Ar$^+$ laser 41 is ON/OFF-modulated, i.e., pulse-modulated by the mechanical chopper 42 or the like, as shown in FIG. 2B(c) and caused to be incident on the E-O probe 39, the electro-optic effect of the ZnTe crystal can be substantially turned on/off synchronized with this ON/OFF modulation of the Ar$^+$ laser.

FIG. 2B(d) shows the light E incident from the PBS 36 onto the photodetector 40 by this pulse modulation. While the light L having a wavelength of 514.5 nm, as shown in FIG. 2B(c), is emitted from the Ar$^+$ laser 41, the light E incident on the photodetector 40 does not change (modulation OFF). However, in the absence of the output L from the Ar$^+$ laser 41, the light E changes (modulation ON).

More specifically, the light E having a peak value according to the voltage of the electrical signal A at the timings ①, ②, and ③ is incident on the photodetector 40.

At the timing ①, sampling is performed with the probe light D shown in FIG. 2C(b) while the voltage of the electrical signal A shown in FIG. 2C(a) is zero, so the light E shown in FIG. 2B(d) does not change.

At the timing ②, sampling is performed with the probe light D at the peak of the electrical signal A. For this reason, the light E exhibits a peak according to the peak voltage of the electrical signal A at the ON timing of modulation, which becomes higher than the peak value at the timing ① by $\Delta I_1$.

At the timing ③, sampling is performed with the probe light D at the attenuation time of the electrical signal A. For this reason, at the ON timing of modulation, the light E exhibits a peak according to the voltage of the electrical signal A at the attenuation time, which becomes higher than the peak value at the timing ① by $\Delta I_2$.

The light E is photoelectrically converted by the photodetector 40, and the signal F shown in FIG. 2B(e) is output to the lock-in amplifier 43. This output signal F is flat at the timing ①. At the timing ②, however, the output becomes higher by $\Delta P_1$ according to $\Delta I_1$ at the ON timing of modulation. At the timing ③, the output becomes higher by $\Delta P_2$ according to $\Delta I_2$ at the ON timing of modulation. The lock-in amplifier 43 performs narrow-band synchronous measurement of the output signal F.

More specifically, the lock-in amplifier 43 detects the output signal F from the photodetector 40 on the basis of the reference signal supplied from the mechanical chopper 42 synchronized with the ON/OFF timing of the electro-optic effect of the E-O probe 39.

In this manner, the voltage measuring apparatus of this embodiment allows measurement similar to that by pulse modulation of the electrical signal to be measured itself.

More specifically, the electro-optic effect of the electro-optic material of the E-O probe 39 is substantially canceled while the light is irradiated from the Ar$^+$ laser 41 onto the E-O probe 39. During this time, the polarized state of the probe light incident from the semiconductor laser 35 onto the E-O probe 39 does not change regardless of the voltage of the device 31 to be measured.

Therefore, when the light emitted from the Ar$^+$ laser 41 is modulated by a modulation means such as the mechanical chopper 42 and caused to be incident onto the E-O probe 39, modulation is applied to voltage measurement of the device 31 to be measured. That is, the voltage of the device 31 can be measured without performing pulse-modulation of the electrical signal to be measured itself, unlike the prior art.

In the above embodiment, the output from the Ar$^+$ laser 41 is pulse-modulated by the mechanical chopper 42 at, e.g., 1 to 100 kHz. However, modulation at several MHz may be applied by an acousto-optic modulator because the response speed of the photoconductive effect of the ZnTe crystal of the E-O probe 39 is high. Modulation is not limited to pulse modulation by ON/OFF modulation and may also be sine wave modulation or small signal modulation. Even with such modulation, the same effect as in the above embodiment can be obtained.

The Ar$^+$ laser 41 having a wavelength of 514.5 nm is used as the second light source. However, an Ar$^+$ laser having a wavelength of 450 to 540 nm may also be used. Alternatively, the second harmonic of an Nd:YAG laser (wavelength: 532 nm) or the second harmonic of a semiconductor laser (wavelength: 400 to 500 nm) may also be used. With a light source having such a wavelength, the same effect as in the above embodiment can be obtained.

The wavelength need not always be shorter than 560 nm as the band absorption edge of the ZnTe crystal. Actually, as far as it allows partial absorption of incident light, the same effect can be obtained. For this reason, an He-Ne laser having a wavelength of 633 nm or a semiconductor laser having a wavelength of 600 to 700 nm can also be used.

In this case, however, the incident light amount must be sufficiently large. To use a semiconductor laser as the second light source, the emitted laser beam is preferably modulated with an arrangement shown in FIG. 4, instead of modulating it by the above-described mechanical chopper 42.

More specifically, a semiconductor laser 51 is desirably directly modulated by an ON/OFF control unit 52. With this arrangement, the arrangement of the apparatus is simplified, and at the same time, the modulation frequency can be increased, which is more desirable for voltage measurement at a high S/N ratio. Note that FIG. 4 shows only the arrangement of the modulation section, and the remaining arrangement is the same as that shown in FIG. 1.

Figure 4:
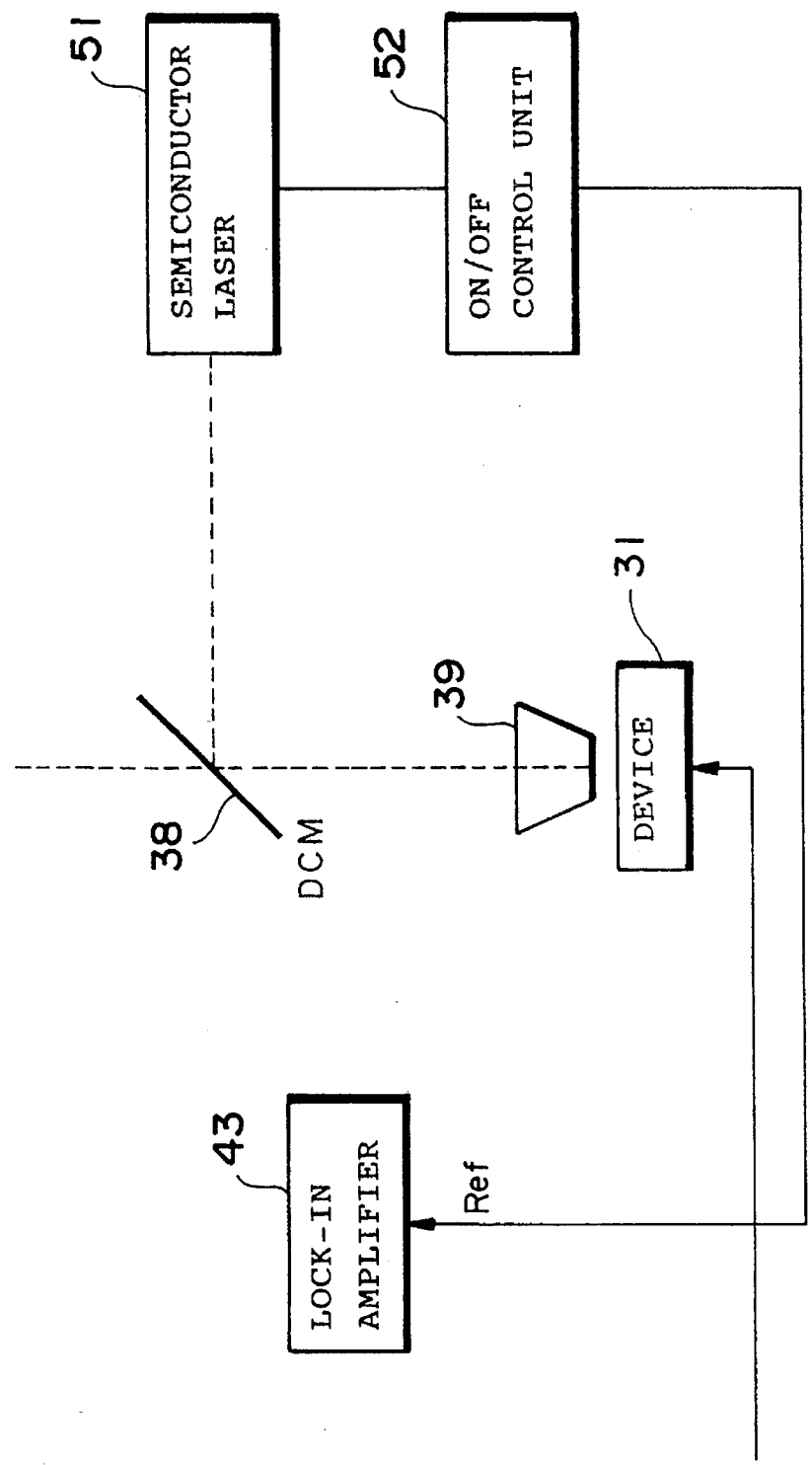
FIG. 4 is a block diagram showing part of a modification of the voltage measuring apparatus according to the first embodiment.

The same reference numerals as in FIG. 1 denote the same parts in FIG. 4.

When the semiconductor laser is to be directly modulated, a modulation method by, e.g., sine wave modulation may also be used in addition to pulse modulation by ON/OFF modulation as far as certain intensity modulation is applied.

Assume that a semiconductor laser having an output of, e.g., 50 mW or more is used as the second light source for modulating the E-O probe 39. In this case, even when the wavelength of the semiconductor laser is 720 nm, and the light absorption by the ZnTe crystal is small, the electro-optic effect in the E-O probe 39 can be canceled by the photorefractive effect or the optical damaging effect.

However, modulation is desirably performed at 1 kHz or less because the response of these effects is slow. Even when voltage measurement is performed by modulation using this effect, the same effect as in the above embodiment can be obtained.

In addition to the ZnTe crystal, any other material including GaAs, CdTe, ZnS, BSO, or a liquid crystal can also be used as the electro-optic material for the E-O probe 39 as far as it has both the electro-optic effect and the photoconductive effect, or both the electro-optic effect and the photorefractive or optical damaging effect.

However, when such a crystal is used for the E-O probe, the second light source for performing modulation must have a wavelength shorter than the band absorption edge of the material. The wavelength need only allow absorption even when it is longer than the band absorption edge. Even with such a crystal used as the material of the E-O probe 39, the same effect as in the above embodiment can be obtained.

As described above, various wavelengths can be selected for the secondary light source in accordance with the types of crystals. At least, it is important that the absorption coefficient of the crystal is larger than the wavelength of the probe light.

More specifically, when the probe light is incident on the crystal, the reflected light must be detected. For this reason, absorption in the crystal must be small. On the other hand, the second light source must be absorbed in the crystal. Since the absorption coefficient of a crystal is generally larger at a shorter wavelength, the second light source must have a wavelength shorter than that of the probe light.

However, some crystals containing impurities specifically have large absorption coefficients at certain wavelengths. In this case, the second light source can be set to a wavelength allowing a large absorption coefficient independently of the wavelength of the probe light.

In the above embodiment, the semiconductor laser 35 is used as a pulse light source, and sampling measurement of an electrical signal waveform which changes with time is performed. In place of the pulse light source, a continuous light source can also be used to measure a DC voltage. In this voltage measurement as well, the same effect as in the above embodiment can be obtained.

Figure 5:
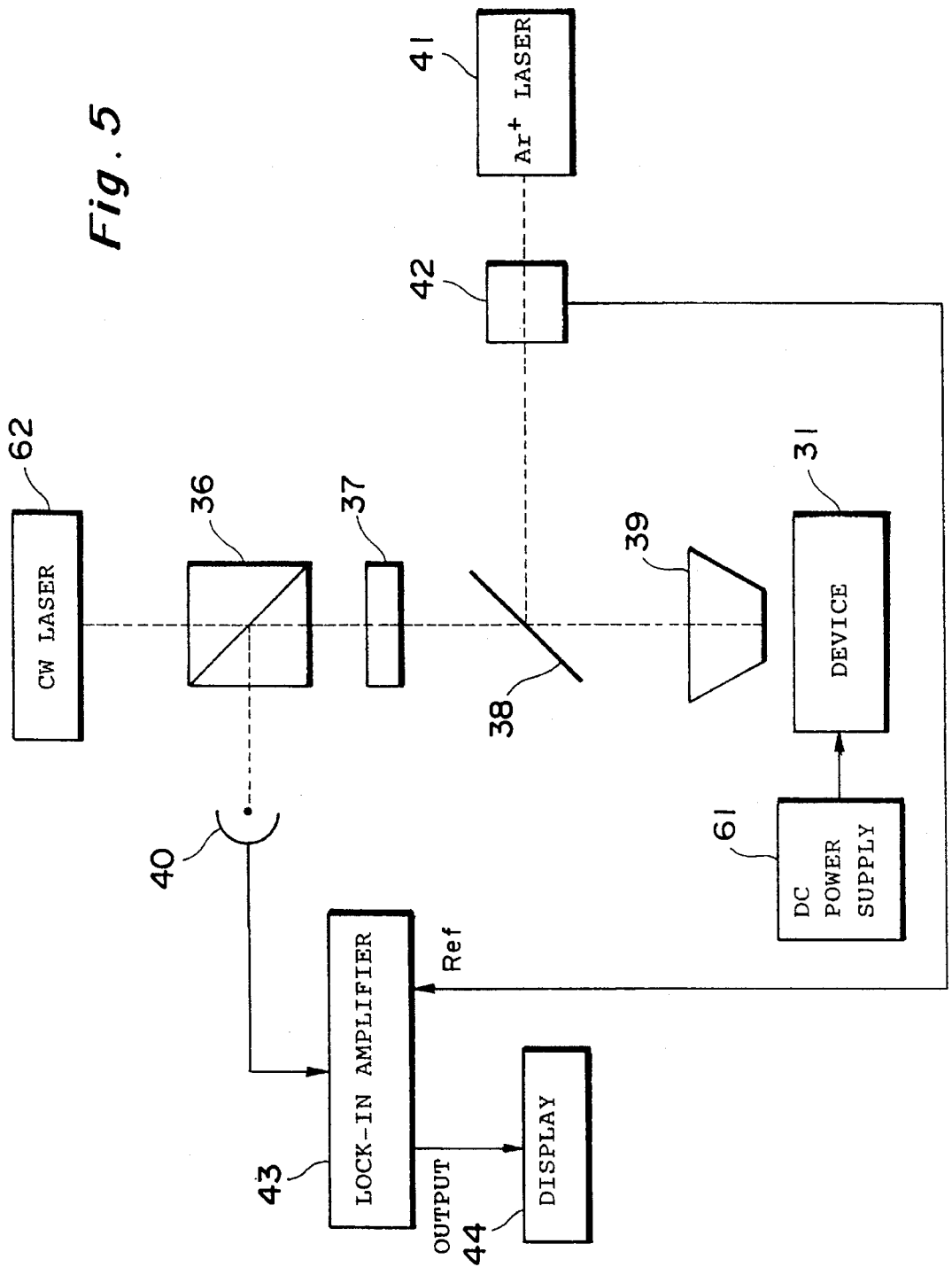
FIG. 5 is a block diagram showing the arrangement of a voltage measuring apparatus according to the second embodiment of the present invention.

FIG. 5 is a block diagram showing the second embodiment of the present invention. The same reference numerals as in FIG. 1 denote the same parts in FIG. 5, and a detailed description thereof will be omitted.

In the second embodiment, a DC voltage supplied from a DC power supply 61 to a device 31 is measured. A CW semiconductor laser 62 having a wavelength of 780 nm is used as the first light source while an $Ar^+$ laser 41 having a wavelength of 514.5 nm is used as the second light source.

When the laser beam emitted from the $Ar^+$ laser 41 is chopped by a mechanical chopper 42, probe light incident from the CW laser 62 onto an E-O probe 39 is modulated. More specifically, while the light is incident from the $Ar^+$ laser 41 onto the E-O probe 39, the electro-optic effect of the E-O probe 39 is substantially canceled, so the polarized state of the probe light does not change.

On the other hand, while the light is not incident from the $Ar^+$ laser 41 onto the E-O probe 39, the E-O probe 39 has the electro-optic effect. For this reason, a change corresponding to the DC voltage of the target measurement device 31 is applied to the polarized state of the probe light.

In the voltage measuring apparatus using the E-O probe, conventionally, a change in output from the photodetector upon application of a voltage is small. For this reason, it is difficult to measure a DC voltage. However, according to the voltage measuring apparatus of this embodiment, the electro-optic effect of the E-O probe 39 can be substantially canceled by irradiating the light from the $Ar^+$ laser 41 serving as the second light source.

This operation is equivalent to modulation of the voltage to be measured. Therefore, voltage measurement can be performed at a high S/N ratio by using a lock-in amplifier or the like even when the voltage to be measured is a DC voltage.

According to the voltage measuring apparatus of the second embodiment: the DC voltage applied to the liquid crystal panel can be measured. For this reason, the conduction test of the electrode of a liquid crystal panel during the manufacturing process can be performed.

In addition, a DC voltage generated by electrostatic charges accumulated on an insulating substrate can also be measured.

Figure 6:
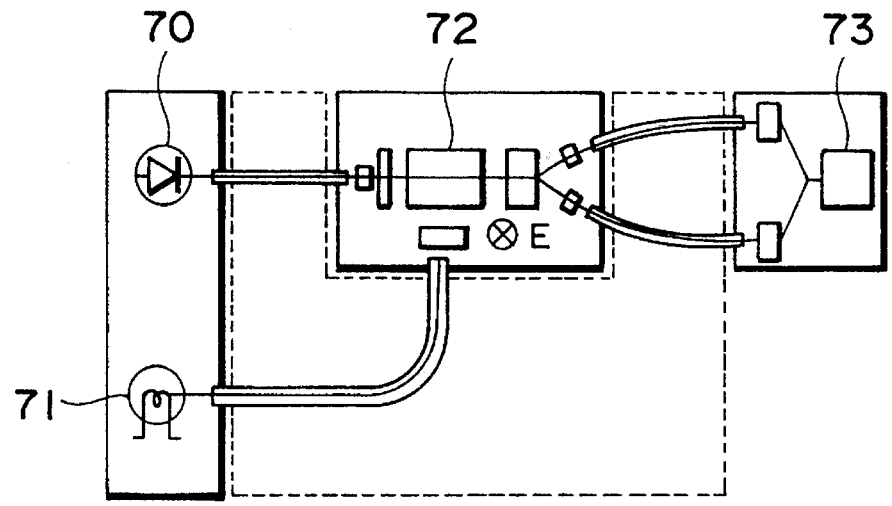
FIG. 6 is a view showing a conventional optical field intensity measurement device.

An optical field intensity measurement device in Japanese Patent Laid-Open No. 59-17170 discloses a technique similar to the present invention. This apparatus discloses a field intensity measurement device shown in FIG. 6. A light-emitting diode 70 irradiates light having an almost constant intensity shown in FIG. 7(a) on an electro-optic medium 72. This electro-optic medium 72 has both the electro-optic effect and the photoconductive effect. A mercury lamp 71 intermittently irradiates light shown in FIG. 7(b) on the electro-optic medium 72. The light irradiated from the light-emitting diode 70 on the electro-optic medium 72 changes its polarized state in accordance with the field intensity by the electro-optic effect of the electro-optic medium 72. A change in polarized state is converted into a light intensity and detected by a photodetector.

Figure 7:
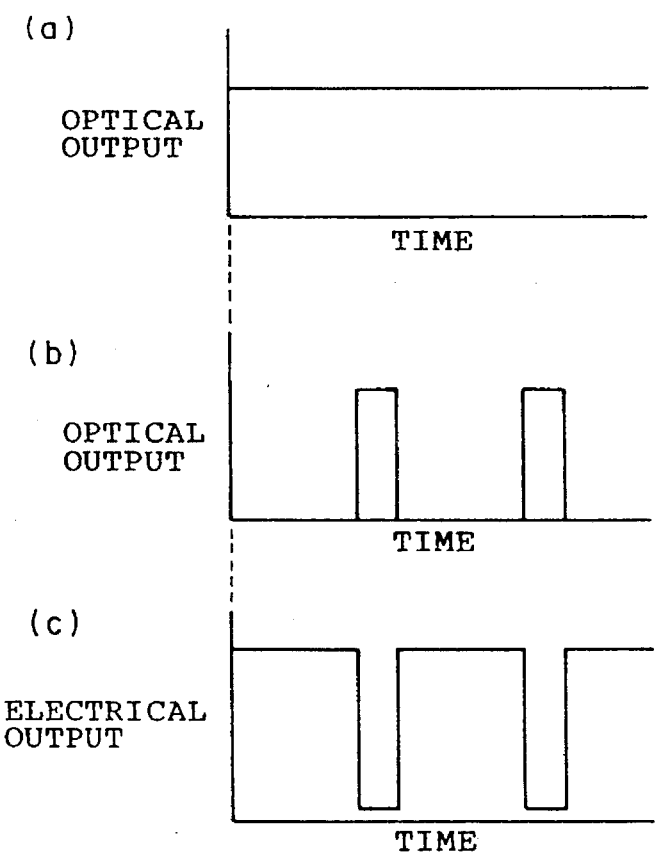
FIG. 7 shows signal waveforms at the respective portions of the field intensity measurement device shown in FIG. 6.
Figure 8:
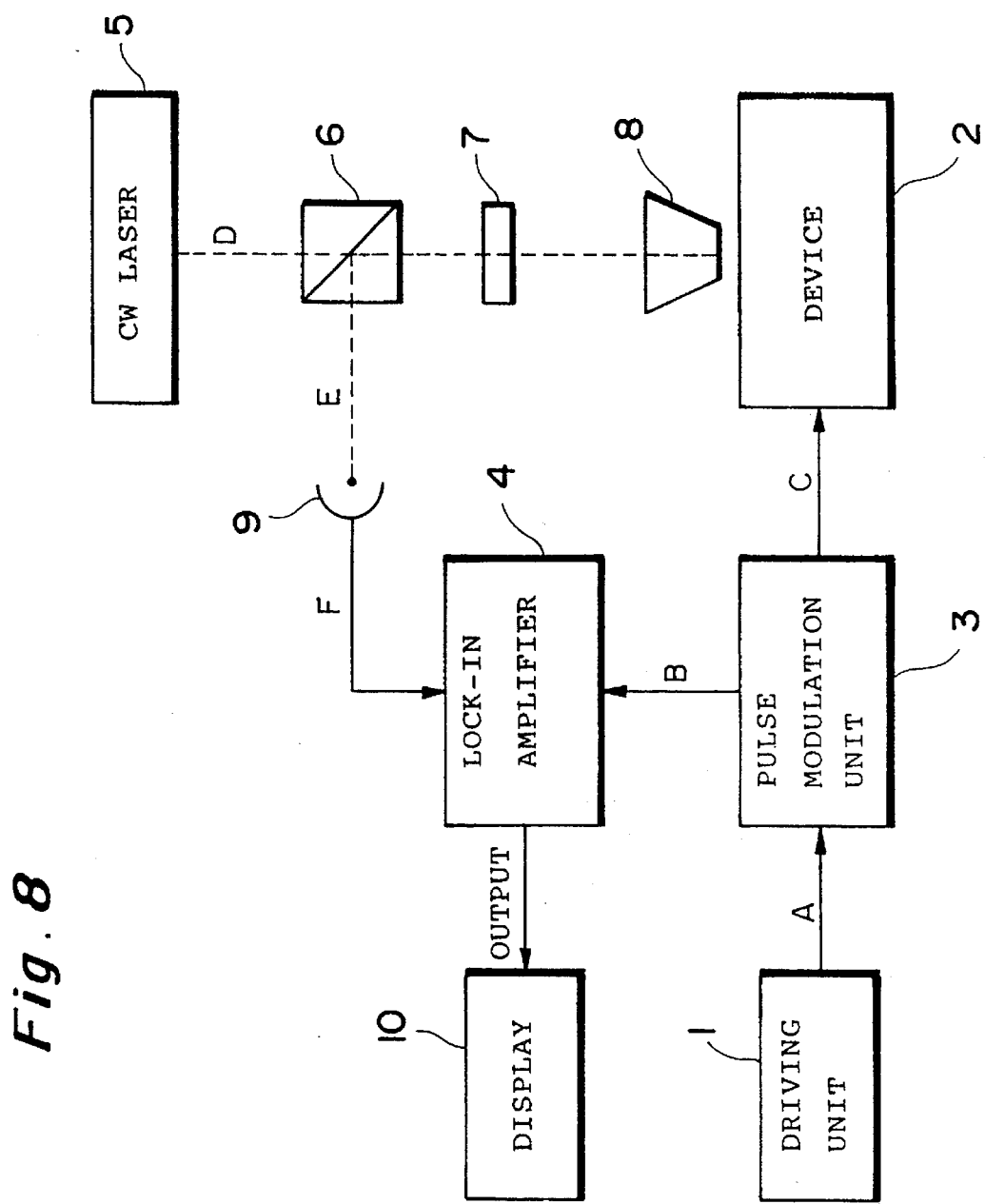
FIG. 8 is a block diagram showing a voltage measuring apparatus according to apparatus 1-1.
Figure 9:
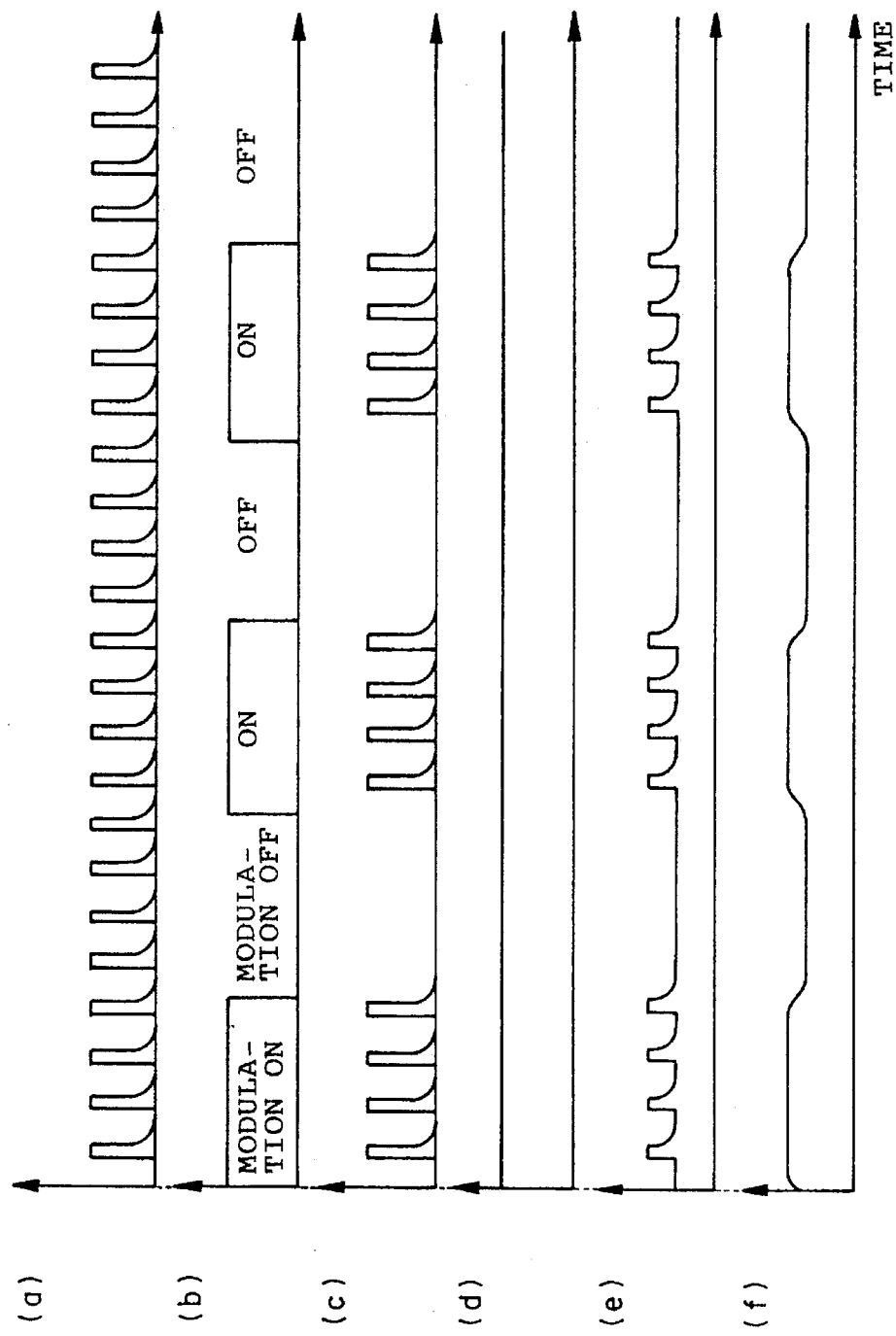
FIG. 9 shows timing charts of signal waveforms at the respective portions of the voltage measuring apparatus according to apparatus 1-1.
Figure 10:
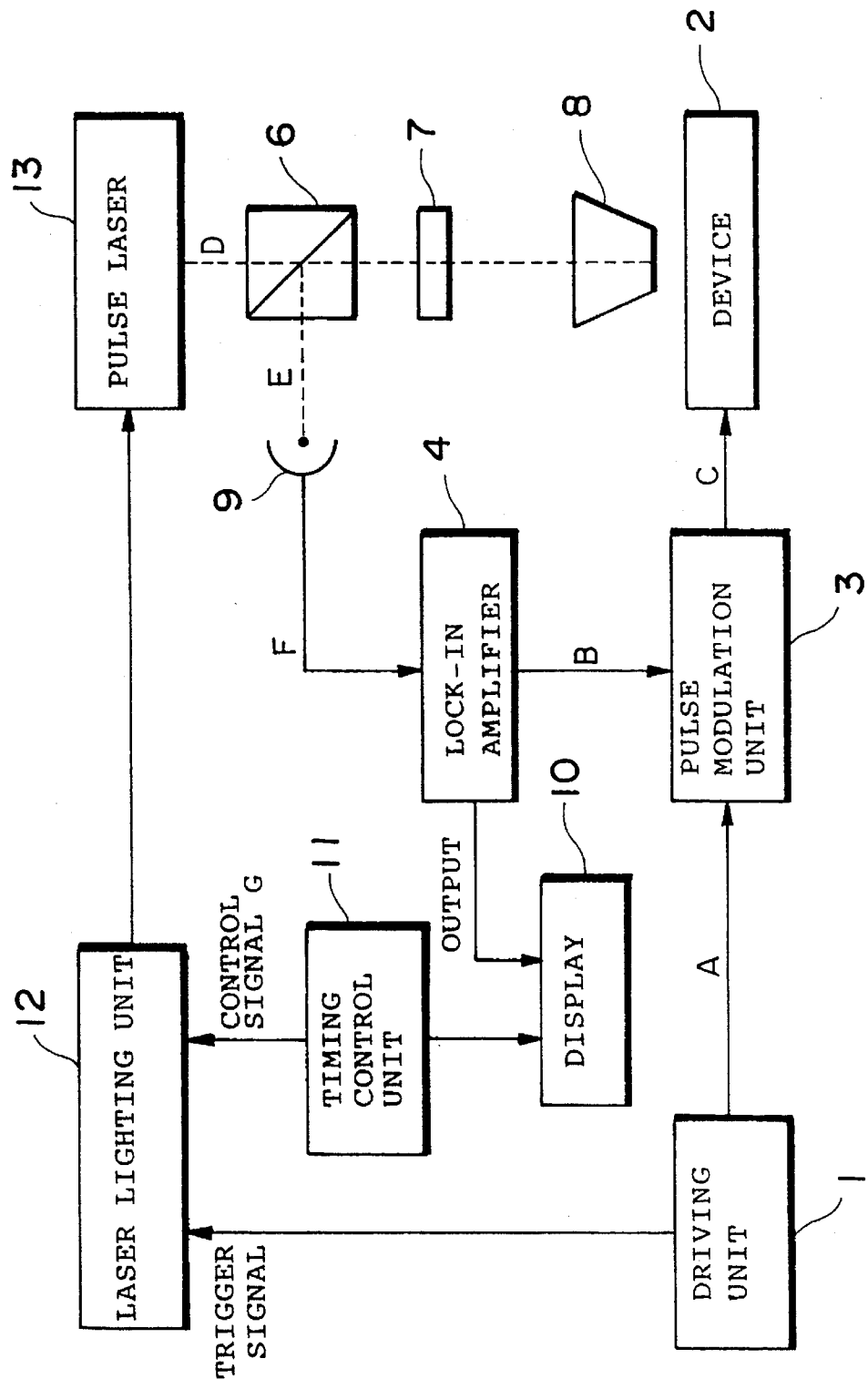
FIG. 10 is a block diagram showing a voltage measuring apparatus according to apparatus 1-2.
Figure 11A:
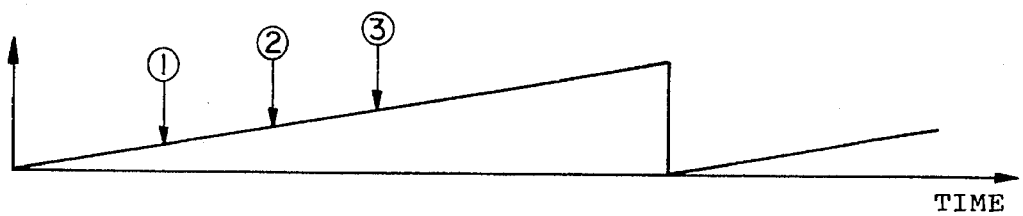
FIGS. 11A to 11C are timing charts showing signal waveforms at the respective portions of the voltage measuring apparatus according to apparatus 1-2.
Figure 11B:
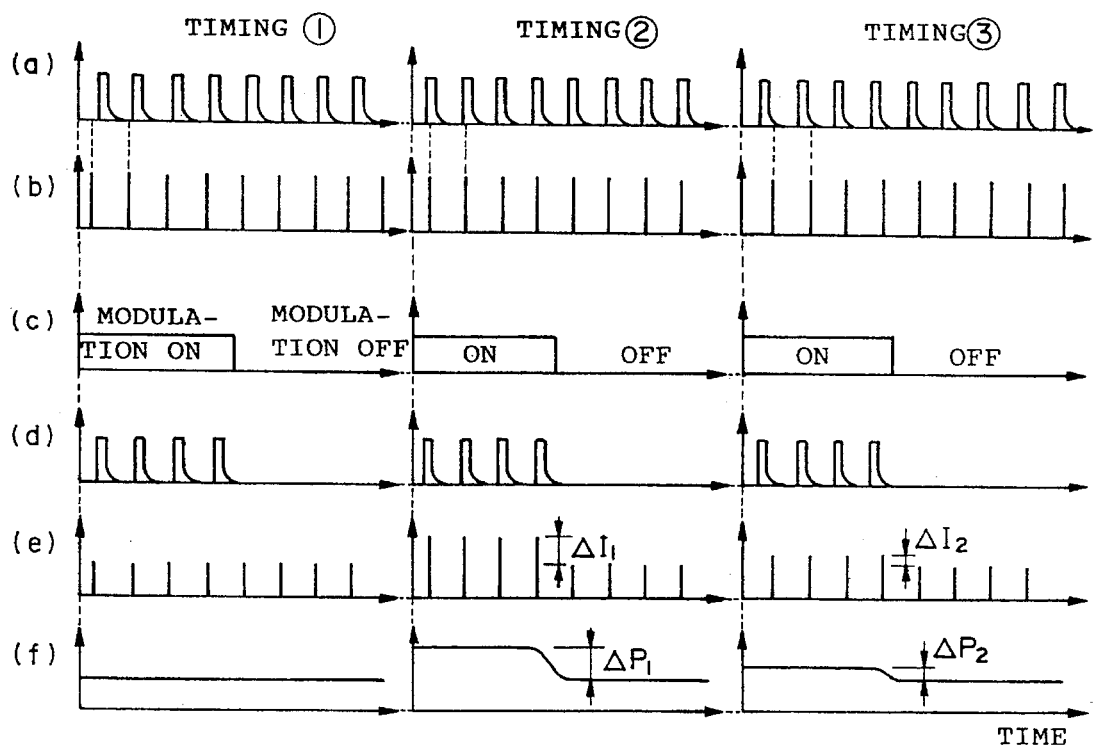
Figure 11C:
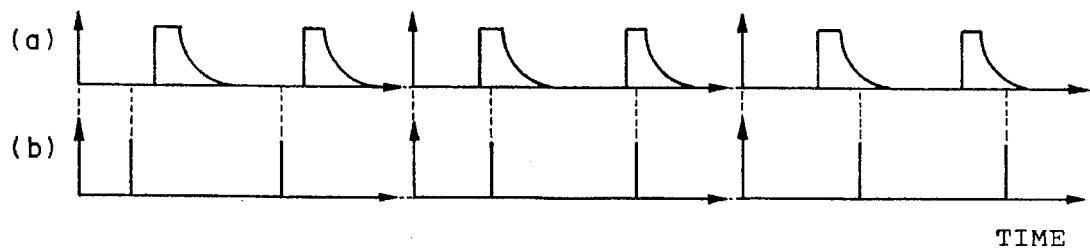
Figure 12:
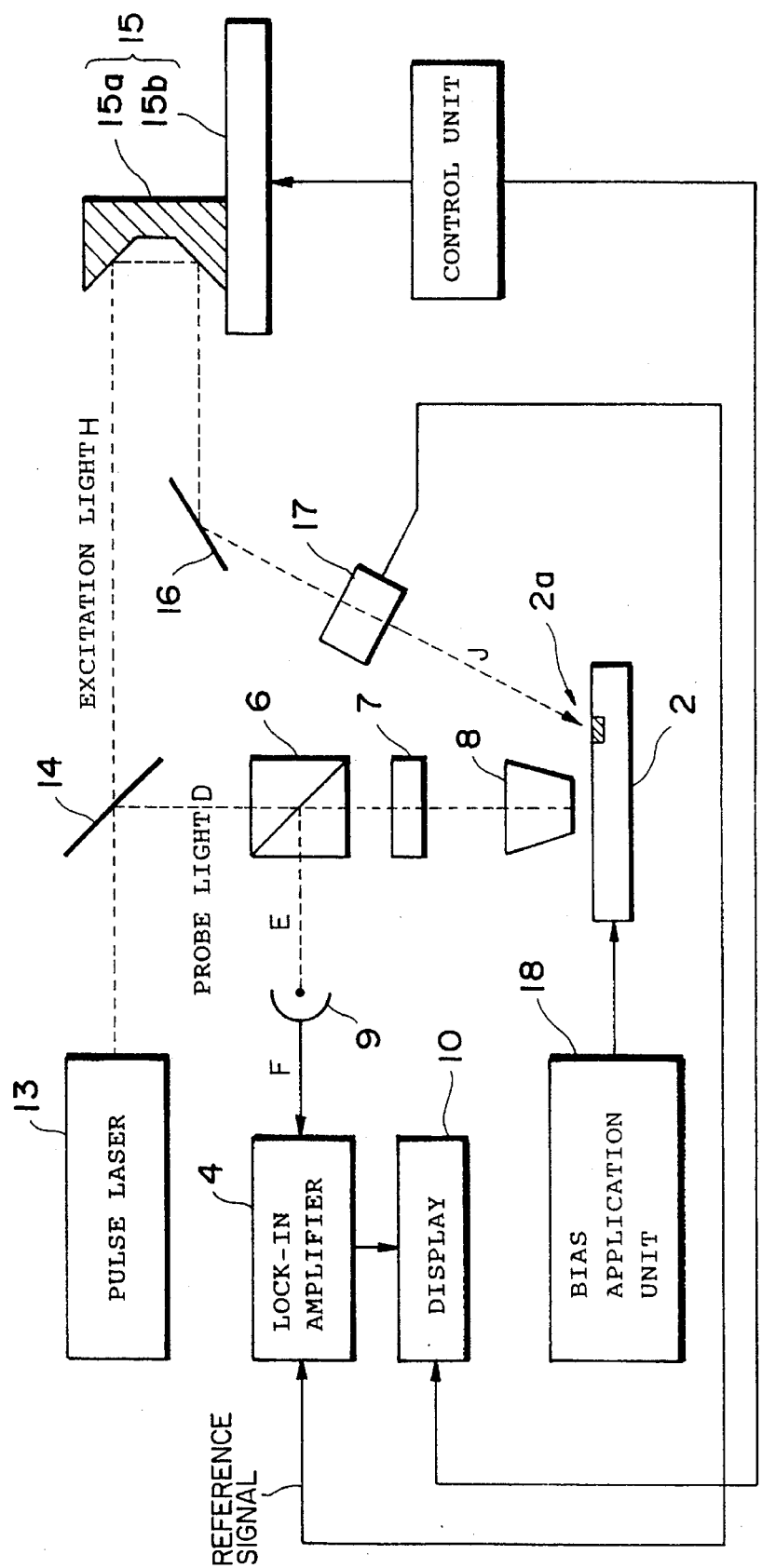
FIG. 12 is a block diagram showing a voltage measuring apparatus according to the second apparatus.
Figure 13A:
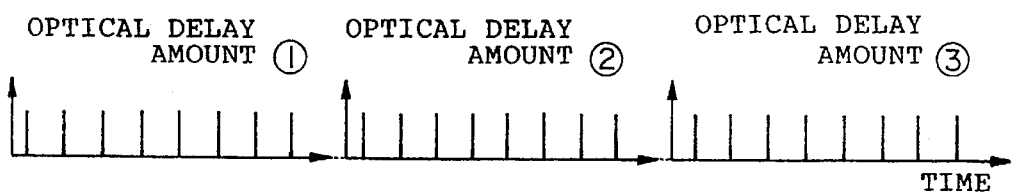
FIGS. 13A to 13D are timing charts showing signal waveforms at the respective portions of the voltage measuring apparatus according to the second apparatus.
Figure 13B:
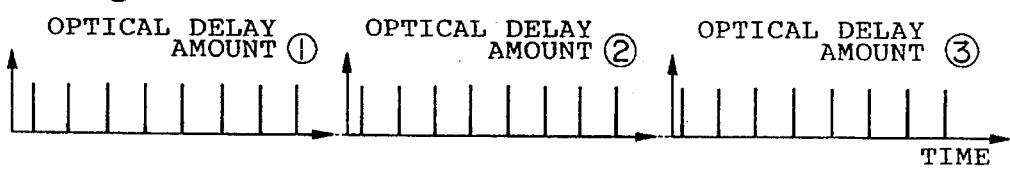
Figure 13C:
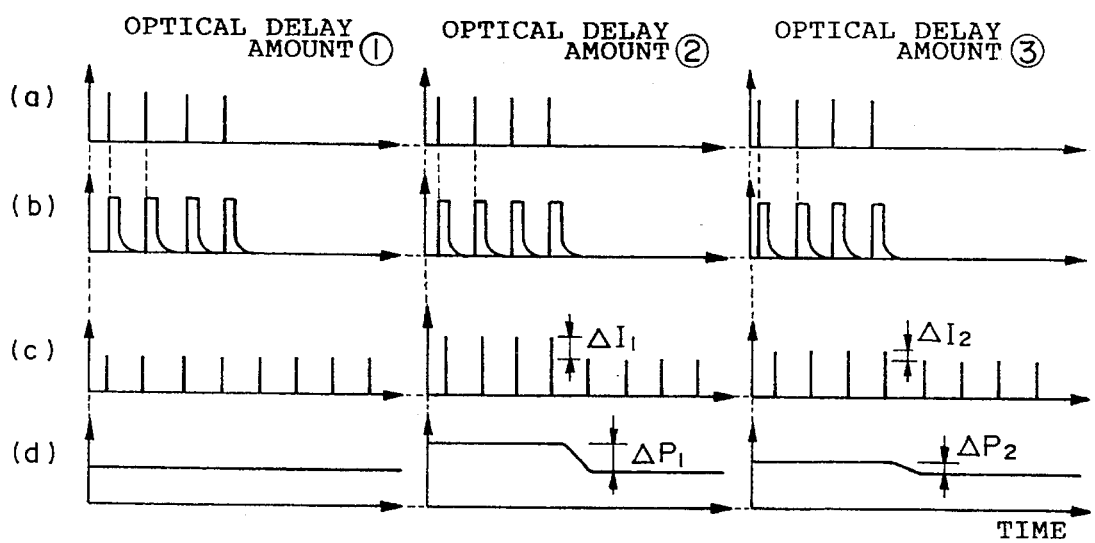
Figure 13D:
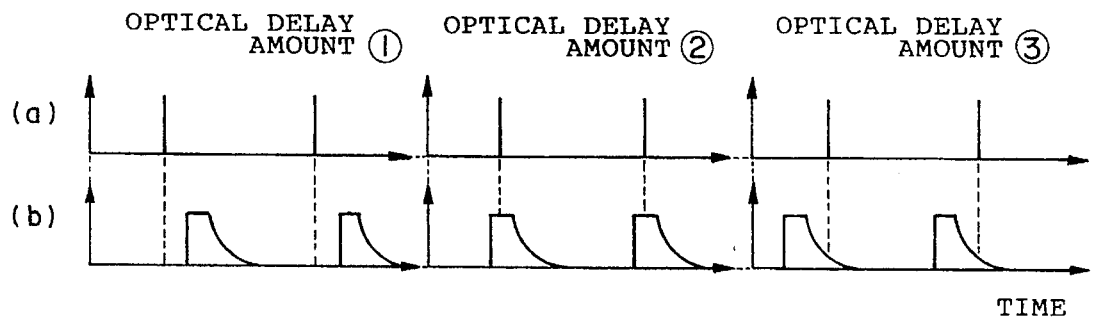
Figure 15A:
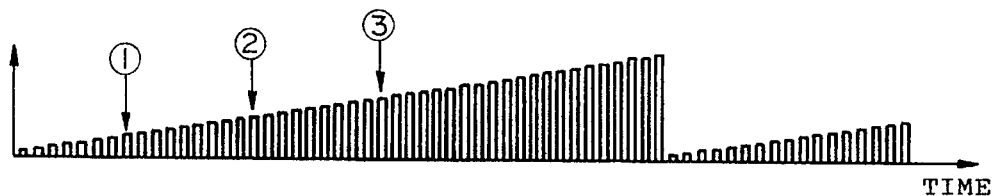
FIGS. 15A to 15F are timing charts showing signal waveforms at the respective portions of the voltage measuring apparatus according to the third apparatus.
Figure 15B:
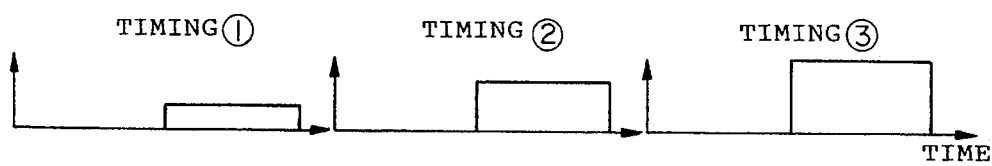
Figure 15C:
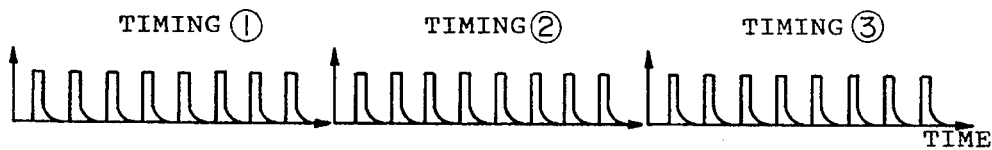
Figure 15D:
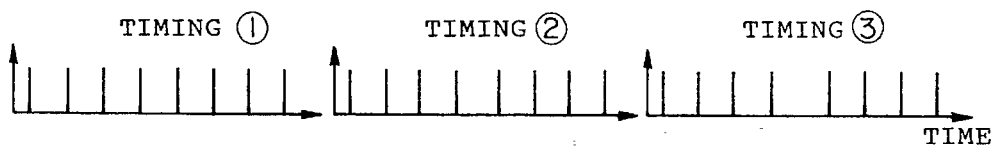
Figure 15E:
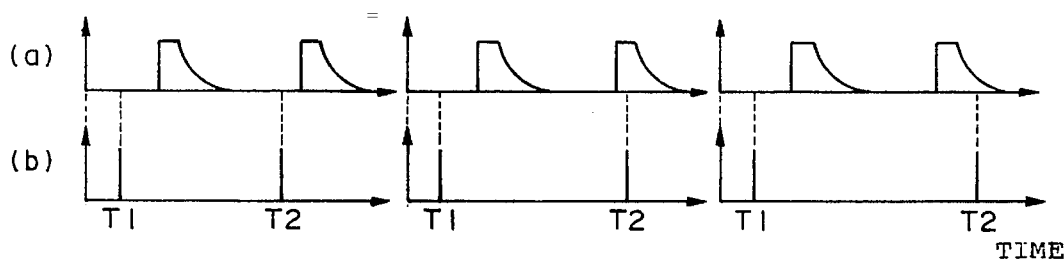
Figure 15F:
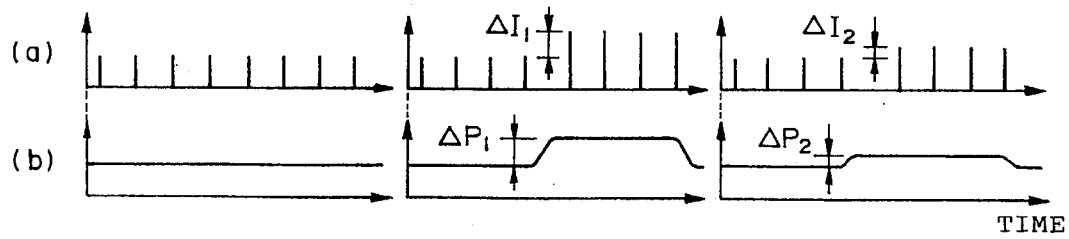
Figure 16:
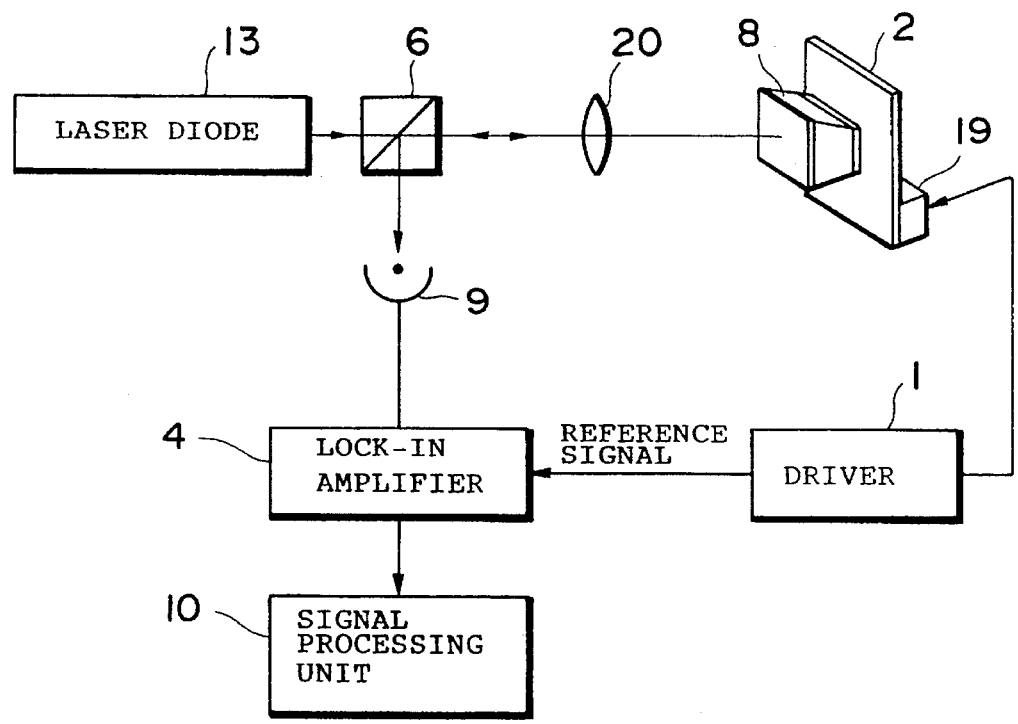
FIG. 16 is a block diagram showing a voltage measuring apparatus according to apparatus 4-1.
Figure 17:
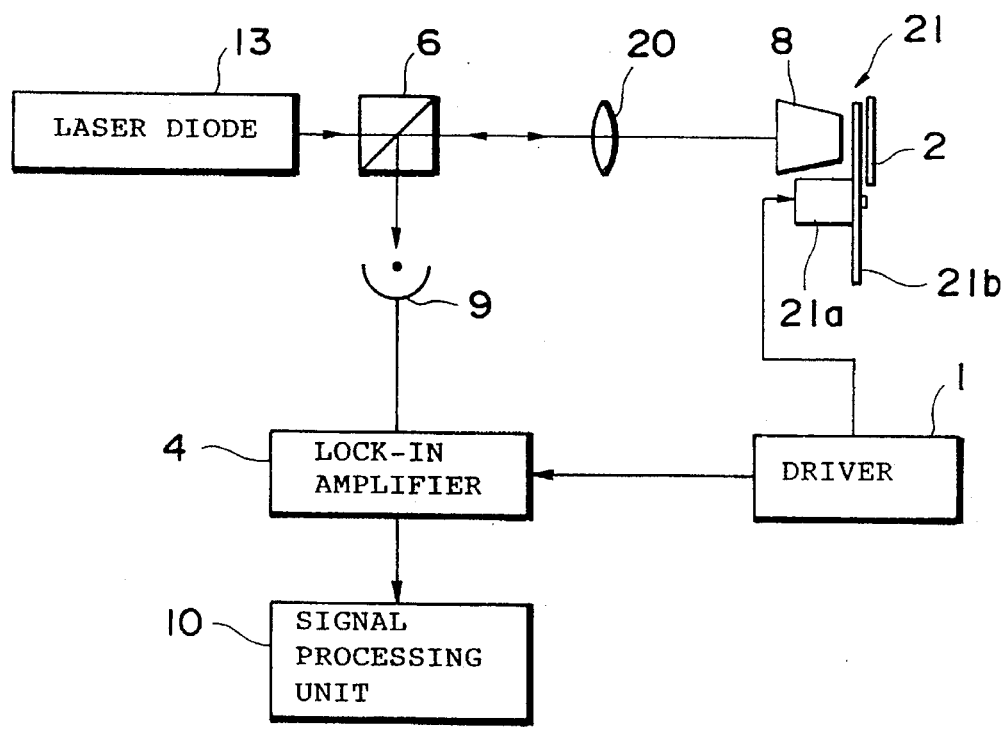
FIG. 17 is a block diagram showing a voltage measuring apparatus according to apparatus 4-2.
Figure 18:
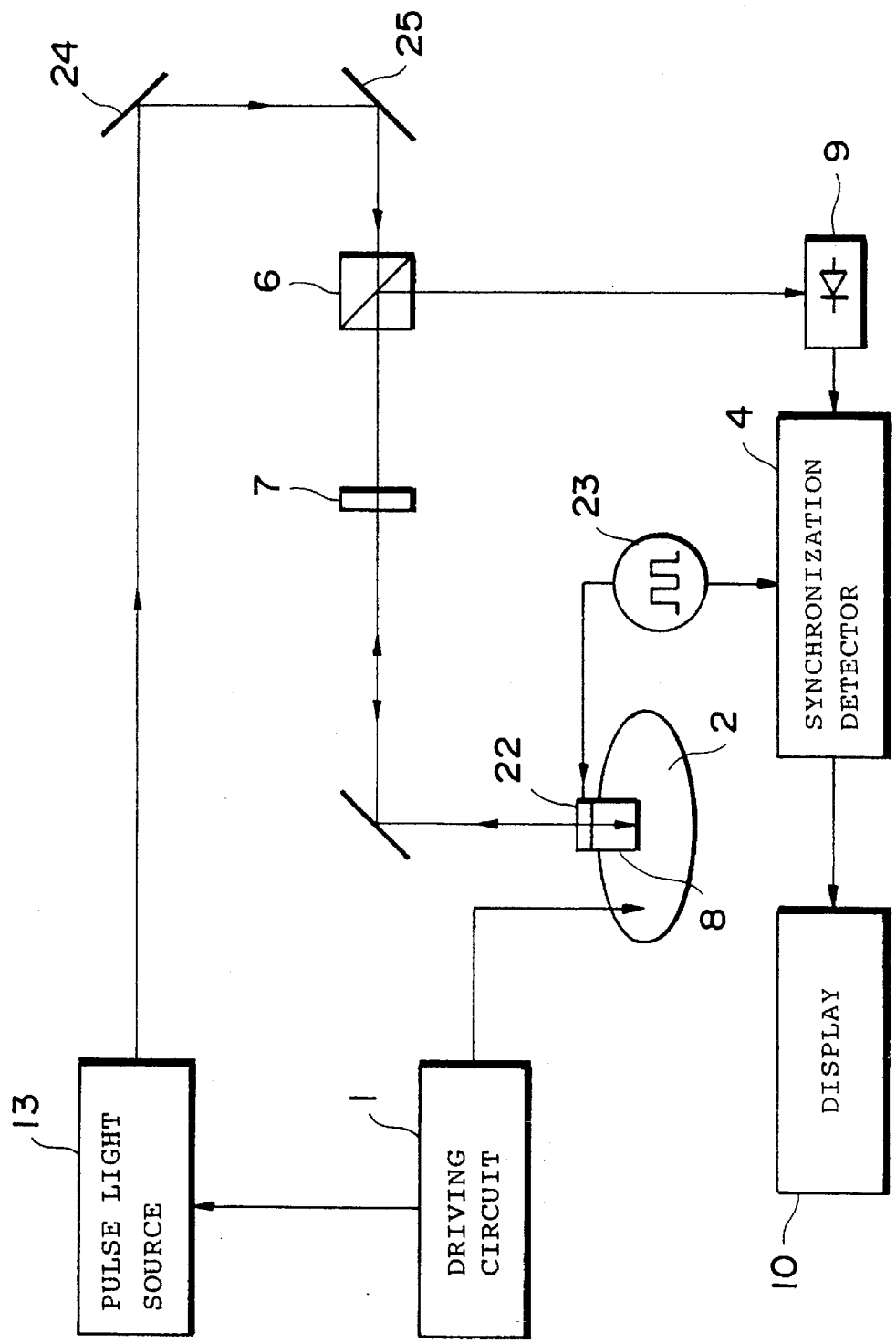
FIG. 18 is a block diagram showing a voltage measuring apparatus according to the fifth apparatus.
Figure 19:
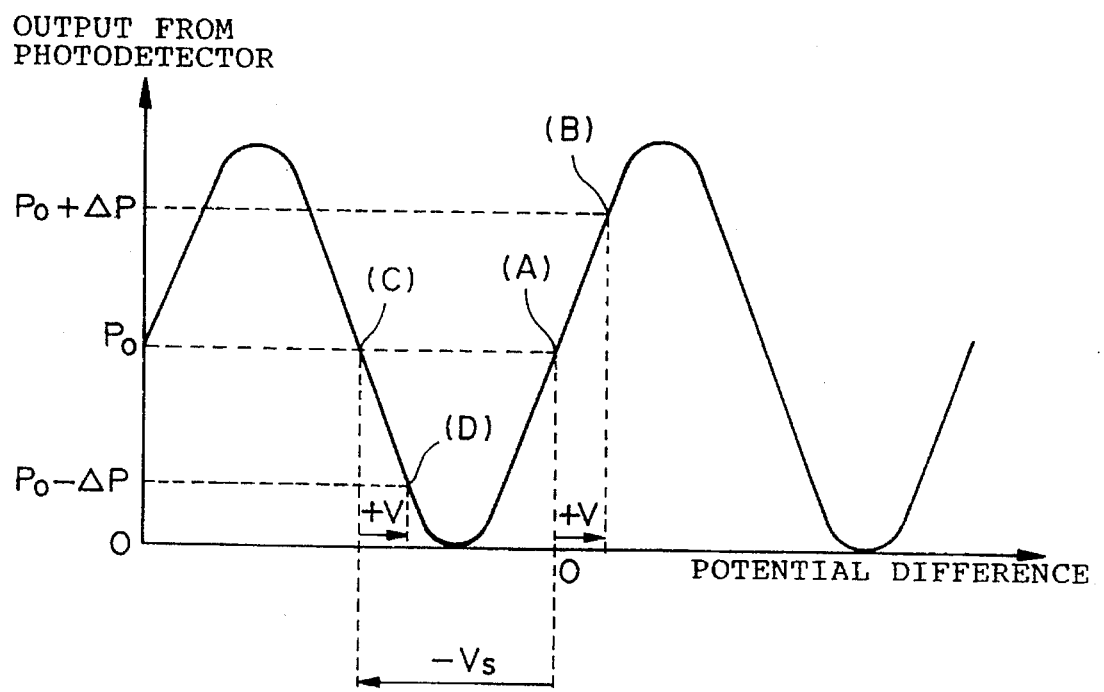
FIG. 19 is a graph showing an output obtained from the photodetector of the voltage measuring apparatus according to the fifth apparatus.
Figure 20:
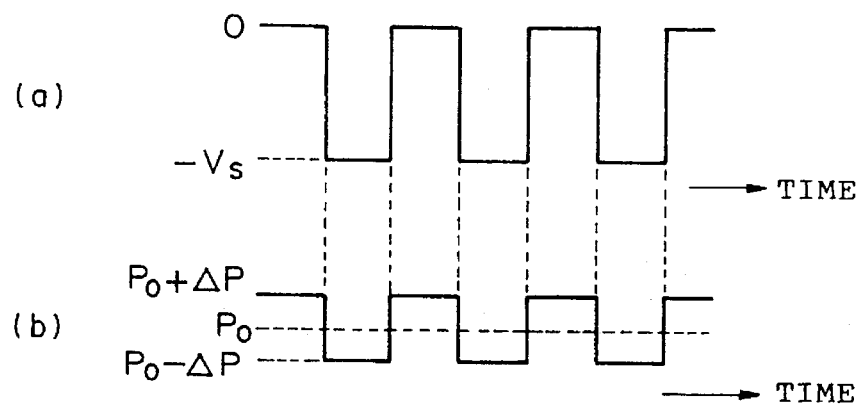
FIG. 20 shows signal waveforms at the respective portions of the voltage measuring apparatus according to the fifth apparatus.

When the detection result is measured by an operation display circuit 73, an electrical output shown in FIG. 7(c) is obtained, and the intensity of an electric field E is measured.

Charge concentration which occurs on the surface of the electro-optic medium 72 upon application of a DC field is neutralized by the photoconductive effect of the electro-optic medium, which is generated by intermittent irradiation of the mercury lamp 71. For this reason, measurement of a DC field which is conventionally impossible is allowed.

In the technique disclosed in this apparatus, the medium having both the electro-optic effect and the photoconductive effect is intermittently irradiated with light having a wavelength for exciting the photoconductive effect, as in this embodiment.

However, in the field intensity measurement device disclosed in this apparatus, the intermittent period of the mercury lamp light consists of an irradiation time of about two minutes and a non-irradiation time of about one minute, which is much longer than the intermittent period of the $Ar^+$ laser at 1 kHz in this embodiment.

Additionally, the intermittent period of the mercury lamp light and the operation display circuit in the field intensity measurement device disclosed in the apparatus have no synchronous relationship therebetween, although this relationship is observed between the intermittent period of the $Ar^+$ laser and the lock-in amplifier of this embodiment. That is, the field intensity measurement device disclosed in this apparatus requires only an arrangement capable of neutralizing charge concentration on the surface of the electro-optic medium.

To the contrary, the voltage measuring apparatus of this embodiment must have an arrangement for sampling the electrical signal to be measured which is repeatedly pulsed at a high speed. That is, the technique disclosed in the prior apparatus is completely different from that of this embodiment.

As has been described above, according to the present invention, while the second light is irradiated from the second light source on the probe, the electro-optic effect of the electro-optic material of the probe is substantially canceled. For this reason, during this time, the polarized state of the first light incident on the probe does not change regardless of the voltage of the device to be measured.

Therefore, when the second light is modulated by the modulation means and incident on the probe, modulation is applied to voltage measurement of the device.

In the prior art in which the electrical signal to be measured itself is modulated, the electrical signal is distorted to disable accurate voltage measurement. Unlike this prior art, voltage measurement can be accurately performed. In the conventional voltage measuring apparatus, the device to be measured is limited to a photodetector driven with excitation light. However, unlike this prior art, the target measurement device is not limited, and the apparatus can also be applied to a general IC or the like. In the conventional voltage measuring apparatus in which the pulse-modulated sawtooth wave is used to modulate the ON timing of the pulse laser, the ON timing of the pulse laser must be precisely and complexly controlled.

However, unlike this prior art, voltage measurement can be easily performed. In the conventional voltage measuring apparatus, it is technically difficult to vibrate the device without bringing it into contact with the E-O probe or rotate the shutter between the E-O probe and the device. However, unlike this prior art, modulation can be applied to voltage measurement with a simple arrangement.

In addition, unlike the conventional voltage measuring apparatus in which a high voltage is applied to the transparent electrode arranged on the rear surface of the E-O probe, discharge between the E-O probe and the device to be measured can be prevented.

Conventionally, a DC voltage cannot be measured because the change in output from the photodetector is small. However, unlike this prior art, even a DC voltage can be measured.

According to the present invention, the E-O effect is modulated without modulating the electrical signal to be measured. With this operation, the electrical signal can be measured at a high S/N ratio.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application No. 195385/1994 filed on Aug. 19, 1994 is hereby incorporated by reference.

What is claimed is:

1. An apparatus for measuring a voltage of a sample, comprising:

(A) a first light source for emitting first light having a first wavelength at a first repetition frequency;

(B) a second light source for emitting second light having a second wavelength, the second wavelength being shorter than the first wavelength;

(C) a mechanical chopper, arranged in an optical passage along which the second light propagates, for shielding the second light at a second repetition frequency, the second repetition frequency being lower than the first repetition frequency;

(D) a probe arranged near the sample and irradiated with the first and second light, such that a refractive index for the first light is changed by an electric field near the sample while the second light is not irradiated in said probe, and the refractive index for the first light is not changed by the electric field near the sample while the second light is irradiated in said probe;

(E) a photodetector for detecting an intensity of a component in a predetermined polarization direction of the first light reflected by said probe; and (F) a lock-in amplifier for picking up and amplifying a signal output from said photodetector synchronized with a light shielding timing of said mechanical chopper.

2. An apparatus according to claim 1, wherein said probe has a ZnTe crystal.

3. An apparatus according to claim 1, further comprising:

(a) a lighting unit for turning on said first light source upon reception of a predetermined trigger signal, and (b) a driving unit for inputting the predetermined trigger signal to said lighting unit and the sample.

4. A voltage measuring apparatus, comprising:

(A) a probe comprised of an electro-optic material having an electro-optic effect representing that a refractive index for first light is changed in accordance with an applied electric field, the electro-optic effect being substantially canceled upon incidence of second light;

(B) a first light source for irradiating the first light on said probe;

(C) a second light source for irradiating the second light on said probe;

(D) modulation means for modulating the second light; and (E) measurement means for detecting a polarized state of the first light reflected by said probe synchronized with modulation of the second light, thereby measuring a voltage of a device to be measured.

5. An apparatus according to claim 4, wherein the electro-optic material has a photoconductive effect, and the electro-optic effect is canceled upon incidence of the second light.

6. An apparatus according to claim 4, wherein the electro-optic material has a photorefractive effect, and the electro-optic effect is canceled upon incidence of the second light.

7. An apparatus according to claim 4, wherein the electro-optic material has an optical damaging effect, and the electro-optic effect is canceled upon incidence of the second light.

8. An apparatus according to claim 4, wherein the electro-optic material is a ZnTe crystal.

9. An apparatus according to claim 4, wherein the voltage of said device is a DC voltage.

* * * * *